(12) United States Patent
Maydar et al.

(10) Patent No.: US 9,673,172 B2
(45) Date of Patent: Jun. 6, 2017

(54) INTEGRATED ELECTRONIC DEVICE INCLUDING AN INTERPOSER STRUCTURE AND A METHOD FOR FABRICATING THE SAME

(71) Applicant: ELTA SYSTEMS LTD., Ashdod (IL)

(72) Inventors: Yaniv Maydar, Tel Aviv (IL); Yohai Joseph, Petach Tiqva (IL)

(73) Assignee: ELTA SYSTEMS LTD., Ashdod (IL)

(*) Notice: Subject to any disclaimer, the term of this patent is extended or adjusted under 35 U.S.C. 154(b) by 0 days.

(21) Appl. No.: 14/649,154

(22) PCT Filed: Nov. 24, 2013

(86) PCT No.: PCT/IL2013/050962
§ 371 (c)(1),
(2) Date: Jun. 2, 2015

(87) PCT Pub. No.: WO2014/087397
PCT Pub. Date: Jun. 12, 2014

(65) Prior Publication Data
US 2015/0303173 A1    Oct. 22, 2015

(30) Foreign Application Priority Data

Dec. 4, 2012   (IL) .......................................... 223414

(51) Int. Cl.
*H01L 25/065*   (2006.01)
*H01L 23/053*   (2006.01)
(Continued)

(52) U.S. Cl.
CPC ........ *H01L 25/0655* (2013.01); *H01L 21/486* (2013.01); *H01L 21/4817* (2013.01);
(Continued)

(58) Field of Classification Search
CPC ............. H01L 25/0655; H01L 21/4817; H01L 21/486; H01L 21/52; H01L 21/56;
(Continued)

(56) References Cited

U.S. PATENT DOCUMENTS 5,585,671 A * 12/1996 Nagesh ................. H01L 23/367
257/697
2006/0027934 A1 * 2/2006 Edelstein .............. H01L 21/486
257/774

(Continued)

OTHER PUBLICATIONS

International Search Report for International Application No. PCT/IL2013/050962 mailed Apr. 22, 2014.

*Primary Examiner* — Whitney T Moore
(74) *Attorney, Agent, or Firm* — Dorsey & Whitney LLP

(57) ABSTRACT

An integrated circuit device and a method of fabricating the same are presented. The integrated circuit device (1) includes two or more active components (30a, 30b), possibly fabricated by different semiconductor technologies, and an interposer structure (10) adapted for carrying the two or more active components such that at least one of the active components is carried on a top surface of the interposer structure. The integrated circuit device also includes at least one metal cap (40), furnished on the top surface of the interposer structure and encapsulating at least one of the active components. Some variants of the integrated circuit device of the invention are suited for operation under extreme conditions.

24 Claims, 12 Drawing Sheets

(51) Int. Cl.
    H01L 23/66     (2006.01)
    H01L 23/498    (2006.01)
    H01L 23/367    (2006.01)
    H01L 23/00     (2006.01)
    H01L 21/48     (2006.01)
    H01L 21/52     (2006.01)
    H01L 21/56     (2006.01)
    H01L 23/14     (2006.01)
    H01L 23/055    (2006.01)

(52) U.S. Cl.
    CPC ............. *H01L 21/52* (2013.01); *H01L 21/56* (2013.01); *H01L 23/053* (2013.01); *H01L 23/147* (2013.01); *H01L 23/367* (2013.01); *H01L 23/49811* (2013.01); *H01L 23/49827* (2013.01); *H01L 23/49838* (2013.01); *H01L 23/49866* (2013.01); *H01L 23/66* (2013.01); *H01L 24/17* (2013.01); *H01L 24/46* (2013.01); *H01L 24/81* (2013.01); *H01L 24/85* (2013.01); *H01L 23/055* (2013.01); *H01L 24/48* (2013.01); *H01L 25/0652* (2013.01); *H01L 2223/6605* (2013.01); *H01L 2223/6627* (2013.01); *H01L 2223/6644* (2013.01); *H01L 2224/05599* (2013.01); *H01L 2224/16225* (2013.01); *H01L 2224/16227* (2013.01); *H01L 2224/32225* (2013.01); *H01L 2224/45015* (2013.01); *H01L 2224/48091* (2013.01); *H01L 2224/48227* (2013.01); *H01L 2224/49175* (2013.01); *H01L 2224/73265* (2013.01); *H01L 2224/85399* (2013.01); *H01L 2224/92247* (2013.01); *H01L 2924/00014* (2013.01); *H01L 2924/01029* (2013.01); *H01L 2924/1033* (2013.01); *H01L 2924/10253* (2013.01); *H01L 2924/10271* (2013.01); *H01L 2924/10272* (2013.01); *H01L 2924/10329* (2013.01); *H01L 2924/15174* (2013.01); *H01L 2924/15192* (2013.01); *H01L 2924/15311* (2013.01); *H01L 2924/20101* (2013.01); *H01L 2924/20102* (2013.01); *H01L 2924/20103* (2013.01); *H01L 2924/20104* (2013.01); *H01L 2924/20105* (2013.01); *H01L 2924/3011* (2013.01); *H01L 2924/3025* (2013.01)

(58) Field of Classification Search
    CPC ................ H01L 23/147; H01L 23/367; H01L 23/49811; H01L 23/49827; H01L 23/49866; H01L 23/66; H01L 24/17; H01L 24/46; H01L 24/81; H01L 24/85
    See application file for complete search history.

(56) References Cited

U.S. PATENT DOCUMENTS

| 2008/0315372 | A1  | 12/2008 | Kuan et al. |
| 2009/0057872 | A1* | 3/2009  | Ehlers ............. H01L 23/3677 257/698 |
| 2009/0212420 | A1  | 8/2009  | Hedler et al. |
| 2011/0068483 | A1* | 3/2011  | Katsurayama ....... C09D 163/00 257/778 |
| 2012/0280374 | A1  | 11/2012 | Choi et al. |
| 2015/0348940 | A1* | 12/2015 | Woychik ............ H01L 25/0657 257/774 |

* cited by examiner

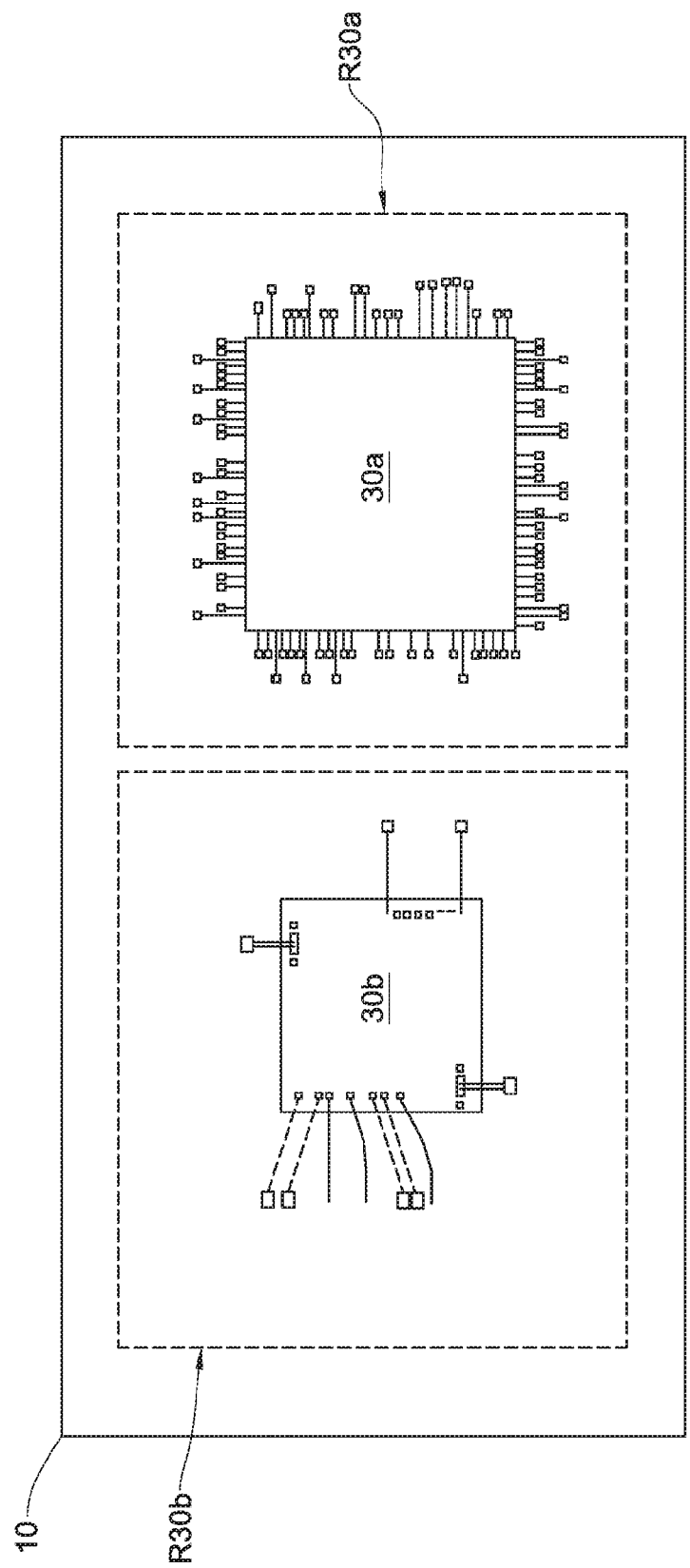

INTEGRATED ELECTRONIC DEVICE INCLUDING AN INTERPOSER STRUCTURE AND A METHOD FOR FABRICATING THE SAME

TECHNOLOGICAL FIELD

This invention is in the field of wafer packaging and relates more specifically to System in Package techniques for use in integration of components of mixed semiconductor technologies.

BACKGROUND

Techniques for integration of multiple active components (e.g. multiple integrated circuits, also referred to as chips or dies) into a single integrated circuit device play a significant role in facilitating small size and high performance integrated devices of various types.

Conventionally, packaged active components are furnished and arranged horizontally on a printed circuit board (PCB). The PCB provides mechanical support as well as electrical connection to the packaged active components. PCBs are typically formed with a laminated polymer substrate which may comprise a multilayer wiring providing electrical interconnection to the active component carried thereby. Accordingly, such PCBs are generally not stable during temperature variations and may shrink/warp when undergoing temperature changes. This consequently limits the density of electrical interconnection which may be accommodated in the PCB and accordingly limits the number and density of active components which may be carried thereby as well as the complexity of such active components. Specifically, with PCB only low to medium density of electrical interconnections may be provided to the active components in with density of about 1/10 expressed as the ratio between the nominal diameter of the interconnection and the nominal distance between interconnections. Provision of smaller interconnection pitches (higher interconnection densities exceeding 1/5) is generally restricted with PCBs.

Directed to allow small size integration of complex active components, which may require higher densities of electrical connections, wafer level packaging (WLP) technologies, which utilize the component substrate as the package substrate in flip chip technology, as well as System in Package (SIP) technologies, which are aimed at integrating multiple components in a common package, are increasingly used. SIP technologies allow multiple active components (dies/chips) to be packaged together within the same package thus enabling closer integration of different of types of chips, which serve as different modules of an integrated circuit device, to reside in a common package. The multiple active components/chips may include different modules of an integrated circuit (IC) device, for example a combination of logic (processor chip) and data-storage (memory-chip) components, a combination of logic and signal amplification and/or transmission/reception components or/and other combinations of components.

In this regard, the term packaging refers to the final stage of semiconductor device fabrication in which one or more dies/chips, which represent the core of the electronic device, are encased in a support that prevents physical damage and corrosion and support the electrical contacts required to assemble the integrated circuit into a system on a PCB.

A SIP integrated device typically includes multiple active components (two or more semiconductor chips/dies) carried by a carrier structure (also referred to herein as an interposer structure). The carrier/interposer structure is used to provide mechanical support and electrical interconnect to the active components carried thereby. Electrical connections to the active components and therebetween are generally provided by vertical electrical vias to connect the component on the top of substrate to the bottom interface with PCB or horizontal layers of interconnections such as IO lines on the top surface of the substrate. In an SIP integrated device, devices utilizing WLP technologies with flip chip configurations, the electrical interconnections are in many cases provided by utilizing horizontal layers of inter-connections (i.e. redistribution-layers (RDLs) formed on one or both of the top and bottom surfaces of the carrier structure) as well as utilizing electric pathways made through the carrier structure between the top and bottom surfaces (also known as through-vias and referred to herein as vias).

For example, U.S. Patent publication No. 2009/0212420 captioned "integrated circuit device and method for fabricating same" discloses fabricating an integrated circuit device including providing a semiconductor substrate comprising a first surface and a second surface, forming a wiring layer on the first surface of the semiconductor substrate, providing a circuit chip, and arranging the circuit chip on the wiring layer of the semi-conductor substrate. The fabricating further includes forming an embedding layer on the wiring layer and on the circuit chip, the embedding layer encapsulating the circuit chip, thinning the semiconductor substrate at the second surface after forming the embedding layer, and forming a conductive via in the semiconductor substrate being electrically coupled to the wiring layer and exposed at the second surface of the semiconductor substrate. Moreover, an integrated circuit device is described.

General Description

There is a need in the art for a packaging technique allowing packaging together of two or more components of mixed technologies in a manner suitable for operation under wide/extensive range of conditions and/or under extreme conditions. There is also a need for a System in Package technique (SIP) for packaging two or more components of different semiconductor technologies on a common interposer structure which may be a passive interposer used for mounting the components or an active interposer in which one or more of the components are fabricated (e.g. on a top or bottom surface thereof). Further there is a need in the art for a SIP technique allowing wafer level packaging of one or more of the mixed technology components on to the common interposer structure.

Some of the known SIP techniques utilize laminate or ceramic or metal frame as part of the carrier structure. Other SIP techniques utilize a silicon carrier substrate/carrier. The thermal extension of a silicon carrier matches that of the silicon based semiconductor chips, and thus such a silicon interposer may provide a mechanically stable surface for carrying the silicon based components.

However, conventional techniques provide poor results when considering packaging of two or more components of mixed semiconductor technologies. Specifically, utilizing conventional SIP techniques for WLP packaging of an active component of one semi-conductor technology to an interposer of other technology may result in cracking and/or warping of the resulting integrated electrical device (interposer and/or active components thereon) in cases where operation under extreme thermal conditions is sought. This is inter-alia because of a mismatch between the coefficient of thermal expansion of the substrate and that of the various active components of different technologies, and also due to lack of sufficient heat evacuation provided under extreme temperatures by conventional techniques. Accordingly, packaging two or more active components of different technologies utilizing conventional SIP techniques typically results in warping, cracking of the integrated device when operating under extreme temperature conditions ranging from −55° C. to 150° C., and/or also in loss of mechanical stability and electrical interconnection integrity, which may consequently lead to failure in the device's operation. Such problems of loss of mechanical stability and electrical interconnection integrity are even more severe in cases where WLP technologies are used for the packaging, which are associated with high density of electrical connections.

Some known techniques utilize a relatively thick silicon carrier (e.g. with thickness exceeding 350 microns) in order to improve mechanical stability. However, thick silicon carriers generally provide poor thermal conductance which is insufficient for operating certain active components at high temperature conditions and thus results in deficient heat evacuation and consequently in deteriorated performance of the active components. Also, in existing integrated electronic devices in which multiple components of mixed technologies are packaged by SIP, the SIP packaging includes a ceramic carrier/substrate (since only the ceramic substrate is known to be compatible for mounting mixed technology components). However the ceramic carrier also provides poor results in terms of power dissipation which is in many cases insufficient for operating the active components at high temperature conditions.

The packaging technology of the present invention solves the above described deficiencies as well as other deficiencies of conventional techniques by providing a packaging technique allowing SIP packaging of two or more components of mixed technologies (e.g. combination of active components of the following semiconductor technologies: Silicon (Si), Silicon-Germanium (SiGe), Silicon-Carbide (SiC), Gallium-Arsenide (GaAs) and Gallium-Nitride (GaN)) in a manner suitable for operation under extensive/extreme conditions. To this end, the technique of the present invention enables packaging together two or more components of different technologies while allowing their operation under a wide range of temperatures (e.g. between −55° C. and 125° C.) and/or extreme range of temperatures (i.e. −65° C. to 150° C.) as well as providing near hermetically sealed packaging which is suitable for operating under various/high humidity conditions (e.g. 85% humidity at a temperature of 85° C.). The invention may be used to package together relatively large active components (dies) which size may for example be in the order of 25×25 mm² while enabling their operation and structural integrity in a wide/extreme temperature range.

Moreover, the packaging technique of the present invention may provide radio frequency (RF) compatibility for high frequency applications and may be used for packaging together one or more high frequency active components utilizing/providing signals from DC and up to 10 to 20 GHz. The packaging technique of the present invention may be used to provide to such active components impedance controlled electrical connections and/or electromagnetic shielding to thereby allow their operation with reduced losses (e.g. reduced insertion/return losses). This allows utilizing the technique of the present invention for packaging signal processing chips together with high frequency components such as signal-amplifier and/or signal-transmitter/receiver. In this connection, the packaging technique of the present invention also provides superior thermal behavior with low thermal resistance (e.g. at least in certain areas of the substrate/carrier) and thus provides high power dissipation which allows packaging high power components, such as amplifiers, which are associated with substantial heat emission.

Thus, according to a broad aspect of the present invention there is provided an integrated circuit device including two or more active components and an interposer structure carrying the two or more active components. At least one of the components is carried on a surface of the interposer structure and at least one metal cap is furnished on that surface, encapsulating at least one of the active components.

In this connection it should be understood that the phrases interposer structure carrying or components carried by interposer should be interpreted herein broadly in the meaning that the components are mounted/furnished on the interposer and/or implemented as a part of the interposer. For example, one or more of the components may be furnished/glued to a surface of the interposer and/or one or more of the components may be fabricated as an integral part of the interposer (e.g. formed utilizing a pattern on one or more surfaces of the interposer or within the bulk of the interposer). In this regard, an interposer structure with which one or more components are integrated (e.g. fabricated thereon) is referred to herein as an active interposer while an interposer in which no component is integrated (e.g. components are merely mounted thereon) is referred to herein as a passive interposer.

Thus according to some embodiments of the invention the interposer structure is configured as an active interposer in which at least one of the two or more active components is implemented as an active component integrated with said interposer structure. Alternatively according to some embodiments of the invention the interposer structure is a passive one with no active components fabricated thereon.

According to some embodiments of the present invention the two or more active components of the integrated circuit device include components of at least two different semiconductor technologies. The interposer structure is configured and operable for carrying the two or more active components and allowing their operation under extreme temperature conditions. For example the integrated circuit device may be configured for operation under extreme temperature conditions ranging between −65° C. to 150° C. The two or more active components of different technologies may include components of at least two of the following technologies: Si chip, SiGe chip, SiC chip, GaAs chip and GaN chip.

According to some embodiments of the present invention interposer structure includes an interposer substrate and an arrangement of spaced-apart conductive vias formed in the substrate and respectively electrically connected to electric connections of the two or more active components. The electric connections of the conductive vias with the two or more active components include at least one of the following: wire-bonding and flip-chip electrical connections.

According to some embodiments of the present invention the interposer structure comprises one or more Redistribution Layers (RDLs) furnished on at least a bottom surface of the interposer structure for providing wiring connections to the conductive vias of the interposer structure. In some cases the RDLs include two-phase RDLs (e.g. for large and small areas).

According to some embodiments of the present invention the interposer structure includes a silicon (Si) based interposer substrate with an arrangement of Copper (Cu) conductive vias formed therein. According to some embodiments at least one of the one or more parameters are selected such that the interposer structure is mechanically stable under an extreme range of temperature conditions thereby preventing cracking and warping of the interposer structure and the active components carried thereby. These selected parameters include one or more of the following or all of them: material of the interposer substrate, a thickness of the interposer substrate, material of the conductive vias, diameters of the conductive vias, pitches of the conductive vias and a fraction of a surface area of the interposer structure covered by the conductive vias (e.g. for different regions of the substrate, different such fractions may be selected in accordance with the type/technology of the active elements carried at such different regions). To this end, the selected parameters may be chosen to ensure mechanical stability of the integrated mechanical stability of the integrated circuit device under a wide/extreme range of temperatures, while also to carry/mount active components of sizes up to about 25×25 mm.

Specifically, according to some embodiments of the invention the conductive vias are configured to provide the interposer structure with a coefficient of thermal expansion (CTE) matching the CTEs of two or more elements associated with at least two different technologies (e.g. two different semi-conductor technologies). This thereby enables operation of the device and the two or more active components under extreme temperature conditions.

According to some embodiments of the present invention the metal cap is configured and operable for enforcing the structural integrity and mechanical stability of said interposer structure under various thermal conditions. Specifically certain properties of the at least one cap such as its material composition (e.g. copper or stainless-steel), its thickness and its shape (e.g. lateral and height dimensions and curvature) may be selected to provide the desired degree of mechanical stability. In some cases, the material composition of the cap is selected to be similar to the material composition of conductive vias formed in a substrate of the interposer structure.

According to some embodiments of the present invention the a bonding material used for furnishing one or more of the active components carried/mounted on the interposer structure is selected to have a sufficient degree of flexibility/elasticity. The sufficient degree of flexibility/elasticity provides for reducing stresses which may occur under different temperature conditions due to a difference in coefficients of thermal expansion between the active components and the interposer structure.

According to some embodiments of the present invention the interposer substrate includes or is formed by a material (e.g. material composition) having relatively high thermal conductivity thereby enabling heat evacuation from the active components mounted on the interposer structure. Additionally or alternatively the conductive vias, which are made in a substrate of the interposer structure, are formed from a material (e.g. material composition) having relatively high thermal conductivity thereby further improving heat evacuation from the active components mounted on the interposer structure. In this connection according to some embodiments some properties of the vias, such as the locations and/or lateral dimensions and/or shapes of at least some of the conductive vias, are selected in accordance with locations and characteristic sizes of at least some of features (e.g. pattern features) of one or more of the active components. Specifically the location, sizes and possibly shapes of one or more of the conductive vias may be selected to provide sufficient thermal coupling between these one or more conductive vias and heat emitting features/parts/regions of the active components. Particularly one or more of the vias may be arranged to be co-aligned with (e.g. located under) some heat emitting parts/features if the active components have a surface thermal interfacing such feature which are associated with substantial heat emission. This further improves heat evacuation and diffusion of heat from these features during their operation under extensive-range/extreme temperature conditions, thus allowing operation of the device in such conditions. It is noted that in some cases such heat emitting parts/features are associated with at least one active component which is configured as an amplifier component (e.g. signal amplifier).

According to some embodiments of the present invention the metal cap is configured to define a cavity. The shape/dimensions of the cavity are configured to provide a sufficient gap between at least one active component encapsulated by the cap and other dielectric materials which may be associated with the integrated circuit device. This provides that the electrical impedance of that active component, which is encapsulated by the cap, is substantially not affected by the other dielectric materials and thereby facilitates proper operation of the active component.

In this connection, such configuration of the cap/cavity is used according to some embodiments of the invention for at least some of the components which are adapted for high frequency operation (e.g. operation with high frequency signals). Such a high frequency component may therefore be encapsulated by the metal cap such that its operational characteristics, being at least one of insertion and transmission losses, are not impaired by other dielectric materials in its vicinity.

In addition, in order to further facilitate operation of the integrated circuit device of the invention with at least one high frequency active component, which is associated with high frequency input/output signals, a certain electrical connection between certain vias of the interposer structure and the high frequency component are configured as RF connections utilizing balanced RF lines. For example, according to various embodiments of the present invention certain vias, connected to high frequency components, are configured as coaxial lines. Also, the electrical connections between those vias and the components are configured as balanced transmission lines and may include an arrangement of one or more of the following transmission configurations/structures along the line: coaxial configuration, strip line configuration, micro-strip line configuration and lateral-strip line (e.g. co-planar strip/waveguide). Utilizing such configurations of the transmission lines may be used to provide the active components with RF connection for frequencies in the order of up to 20 GHz.

According to certain embodiments of the present invention, the integrated circuit device is configured as a near hermetically sealed device capable of withstanding a broad range of humidity conditions. This is achieved by configuring the metal cap and its attachment to the interposer structure to provide fine leak sealing resulting in near hermetically sealed packaging suitable for operation under various humidity conditions.

According to some embodiments, the cap includes a vent opening defined thereon. The vent prevents, or at least reduces, pressure build up in a cavity defined between the cap and the interposer structure under varying temperature conditions (e.g. the vent is aimed at preventing the occurrence of a so called "pop-corn" effect at high temperature operation of the device). To preserve a fine leak sealing in such embodiments, the vent is generally covered with a material (e.g. porous/polymer material) allowing for pressure release though the vent while preventing, or substantially reducing, the amount of humidity passing therethrough.

According to some embodiments of the invention, the integrated circuit device includes a mold layer covering the top surface of the interposer structure with the two or more active components and the at least one cap which encapsulates at least one of the components. The mold layer may for example include (or be formed of) one or more dielectric materials. The cap (e.g. formed of conductive/metal material) is configured to define a cavity that provides a sufficient gap between at least one active component encapsulated by the cap and the mold layer along a height axis of the cap (e.g. along an axis perpendicular to the interposer surface at which the active component is mounted). The dimensions of the cavity and the gap are selected/configured such that the operational characteristics of a high frequency active component encapsulated in the cap are not impaired by the presence of the mold layer. Specifically, the cavity and the gap are configured to reduce the effects of an impedance mismatch between the active component and the mold layer when the former produces high frequency signals.

As noted above, in some embodiments, the cap includes a vent opening defined thereon. In some case the mold layer is arranged to cover the vent opening, thereby providing a near hermetically sealed packaging suitable for operating under various humidity conditions.

According to another broad aspect of the present invention there is provided a method for manufacturing an integrated circuit device, the method including:

providing an interposer substrate;

implementing an arrangement of through conductive vias in the substrate interposer to generate an interposer structure including at least the interposer substrate and the vias; the arrangement of the vias is configured to provide electrical connections to at least two active components of different technologies which are to be carried by the interposer structure; and providing at least one active component of the active components and mounting the at least one active component on the interposer structure;

encapsulating the at least one active component by furnishing at least one cap over a surface of the interposer structure at which the active component is mounted.

According to some embodiments of the present invention the interposer substrate is configured to form a passive interposer structure. Alternatively, the interposer substrate is configured as an active interposer including one of the active components implemented thereon. In the latter case the method further includes fabricating at least one of said active components in a region of the interposer substrate.

According to some embodiments of the present invention the method also includes configuring the arrangement of the vias such as to provide at different regions of the interposer structure different coefficients of thermal expansion (CTEs) substantially matching those of the active components which are to be carried by the interposer structure at those regions. The active components utilize different semiconductor technologies and are accordingly associated with different CTEs. Alternatively or additionally, according to some embodiments of the present invention, the method also includes configuring the arrangement of the vias to ensure sufficient heat conductance for evacuating heat from one or more features of at least one active component, which is associated with substantial heat emission.

According to yet another broad aspect of the present invention there is provided a technique for applying a mold layer to an integrated structure (e.g. integrated electronic device). The method includes providing an integrated structure to be molded, applying a mold layer on at least some regions of integrated structure(s). This includes baking the integrated-structure with the mold layer applied thereto at a substantially steady baking temperature. Then, the integrated-structure with the mold layer is gradually cooled down while preserving a substantially homogeneous temperature throughout the integrated-structure. According to some embodiments the cool down rate is in the order of about 10° C./hour. In this regard, the rate of the gradual cool down may depend on the size of the wafer/integrated-structure. Larger wafers typically require slower cool down rates and thus longer cool down durations while larger wafers may be cooled down faster (e.g. with rates of 20° C./hour) without developing warpage or cracks. According to some embodiment of the present invention metal (e.g. copper) plate(s) are thermally coupled to the integrated structure with the mold layer to facilitate gradual and homogeneous cooling. Specifically, in some cases, one or more plates of high weight are placed on top of the integrated structure to apply pressure to the structure and thereby further eliminate/prevent warpage/cracking of the structure.

Thus, the present invention provides a System-in-Package (SIP) technique advantageously allowing integration of active components of different technologies in a manner allowing their operation under a wide/extreme range of temperature and humidity conditions. A more detailed description of the various embodiments of the present invention and its advantages is provided in the detailed description of embodiments below.

BRIEF DESCRIPTION OF THE DRAWINGS

In order to understand the disclosure and to see how it may be carried out in practice, embodiments will now be described, by way of non-limiting example only, with reference to the accompanying drawings, in which:

FIGS. 2A to 2E exemplify an integrated circuit device according to present invention in which SiGe and GaAs active components integrated and packaged together wherein: FIG. 2A is a schematic illustration of a side cross-sectional view of the integrated circuit device; FIGS. 2B and 2C are schematic illustrations showing top views of the interposer structure of integrated circuit device without and with the active components furnished thereon respectively; FIG. 2D a schematic illustration showing in more detail a side cross-sectional view of a part of interposer structure; and FIG. 2E a schematic illustration showing the mounting of an active component, being a high frequency signal amplifier, on the interposer structure.

DETAILED DESCRIPTION OF EMBODIMENTS

Figure 1:
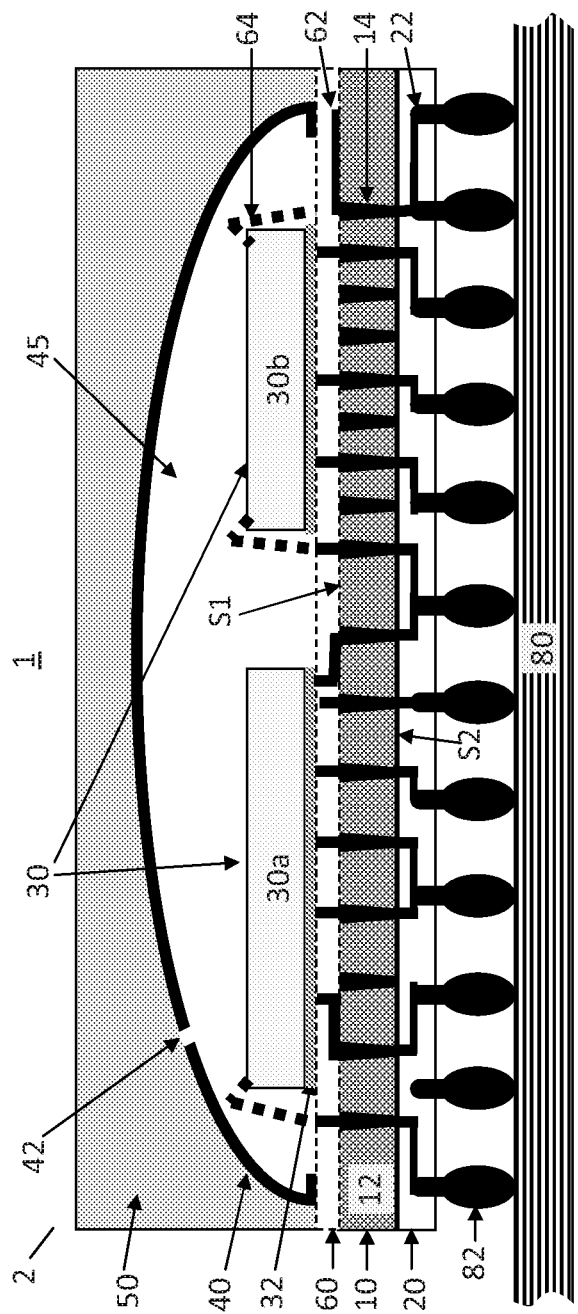
FIG. 1 is schematic illustration of an integrated circuit device according to an embodiment of the present invention.

Reference is made together to FIGS. 1 and 2A to 2E illustrating schematically an integrated circuit device 1 according to the some embodiments of the present invention. The same reference numerals are used in all the figures of the present application for designating similar modules/elements and/or elements/modules having similar functionality.

The integrated circuit device 1 is configured as a System in Package, providing a common SIP packaging 2 for two or more active components 30 that are included in the device 1 (two chips 30a and 30b are illustrated in the figures). The integrated circuit device 1 and specifically the packaging 2 includes an interposer structure 10 (carrier structure) carrying the two or more active components 30 on a top surface thereof S1 and at least one cap 40, furnished on the top surface S1 and encapsulating at least one of the two or more active components 30. The interposer structure 10 includes an interposer substrate 12 and an arrangement of spaced-apart conductive vias 14 (e.g. through silicon vias TSVs) formed in the substrate and respectively electrically connected to electric connections of the two or more active components 30. The interposer substrate 12 may further include one or more Redistribution Layers (RDLs) (20 and 60 optional layer) such that at least one RDL layer 22 is furnished on at least a bottom surface of the interposer structure 10 for providing wiring interconnections between conductive vias 12 and at least some of the solder joints 82 (e.g. wafer bumping) which are used to provide solder connections between the package 2 of the integrated circuit device 1 and an application board 80 (e.g. PCB) on which device 1 is to be mounted as well as for providing electrical inter-connection to and/or between integrated circuits (Active Components) carried by the interposer structure 10 (e.g. mounted thereon or implemented therein.

The two or more active components 30 are carried by the interposer structure 10 and one or more of them may also be implemented/integrated with the interposer substrate 10 (the interposer in this case is referred to herein as an active interposer). Also, one or more of the active components may be mounted/furnished on the interposer 10 utilizing suitable wafer-level packaging techniques.

The interposer structure 10 may be an active interposer (i.e. implementing one or more of the active-elements/electronic-circuits as an integral part thereof) or a passive interposer serves for mounting the active elements thereon. According to some embodiments of the present invention, one or more of the two or more active components 30 which are carried by the interposer structure 10 may actually be implemented on/within the interposer structure 10 itself. In this connection, the interposer 10 may an active interposer structure in which one or more of the active components 30 are fabricated (e.g. by use of any suitable semi-conductor fabrication technology). For example considering the interposer structure 10 is formed of a certain semi-conductor material/technology, an active component utilizing the similar material/technology may be fabricated on the interposer structure 10. Specifically, utilizing interposer structure 10 formed with silicon material, a silicon based active-component, such as a signal processing chip, may be fabricated/integrated in the interposer itself instead of being mounted on a surface of the interposer. The integrated circuit device 1 is generally configured and operable for carrying the two or more active components 30 such that the components are furnished/mounted on a surface thereof or integrated therewith to form a System in a Package including the two or more components packaged with the interposer structure 10. In some embodiments of the present invention the integrated circuit device 1 is also configured and operable to carry on the same interposer structure two or more components of different semiconductor technologies while allowing their operation under extreme conditions (e.g. a wide/extreme range of thermal and/or humidity conditions). For example, the integrated circuit device 1 may be configured for carrying together components fabricated by two or more of the following semiconductor technologies: Si, SiGe, SiC, GaAs and GaN, and possibly also components of other semiconductor technologies. Configuration of the integrated circuit device 1, as described more specifically below, allows the proper operation of such components and preservation of their structural integrity and packaging 2 structural integrity under a wide range of temperature conditions (e.g. between −55° C. and 125° C.) and in some embodiments even in an extreme range of environmental and operational temperature conditions −65° C. to 150° C.

Figure 2A:
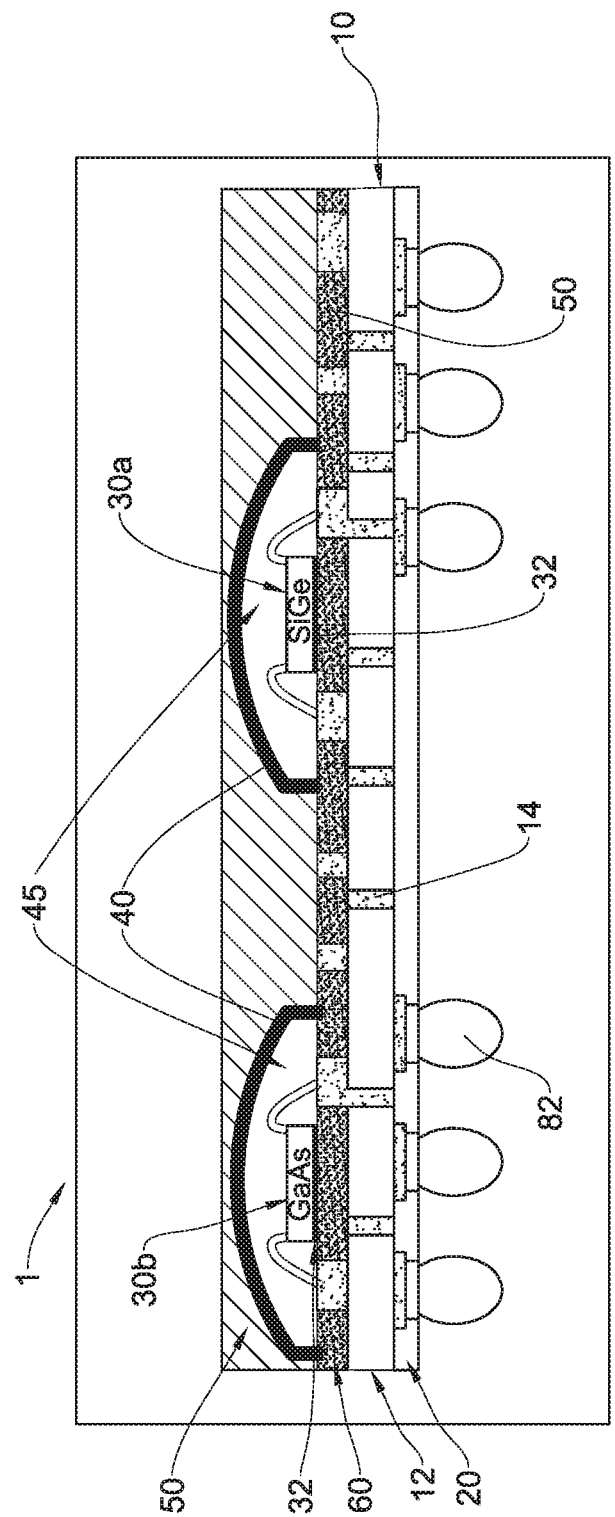
Figure 2B:
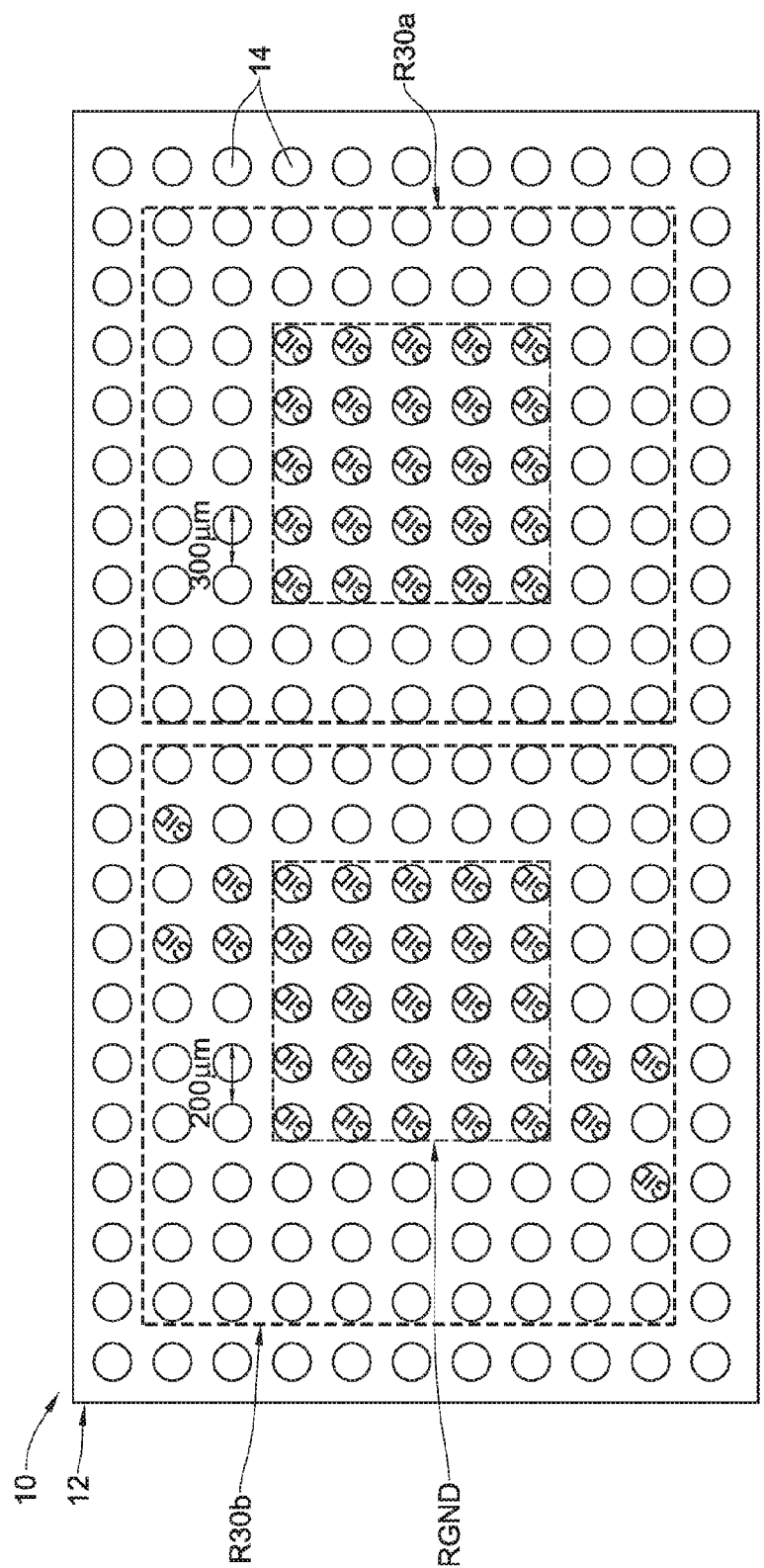
Figure 2D:
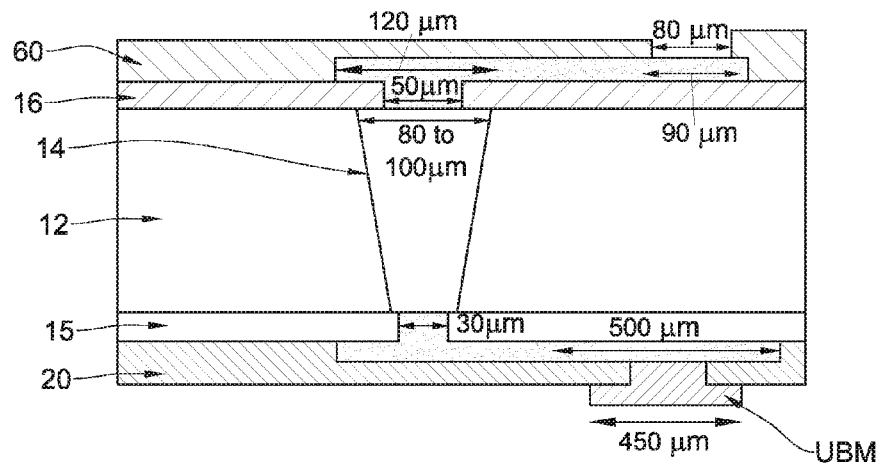
Figure 2E:
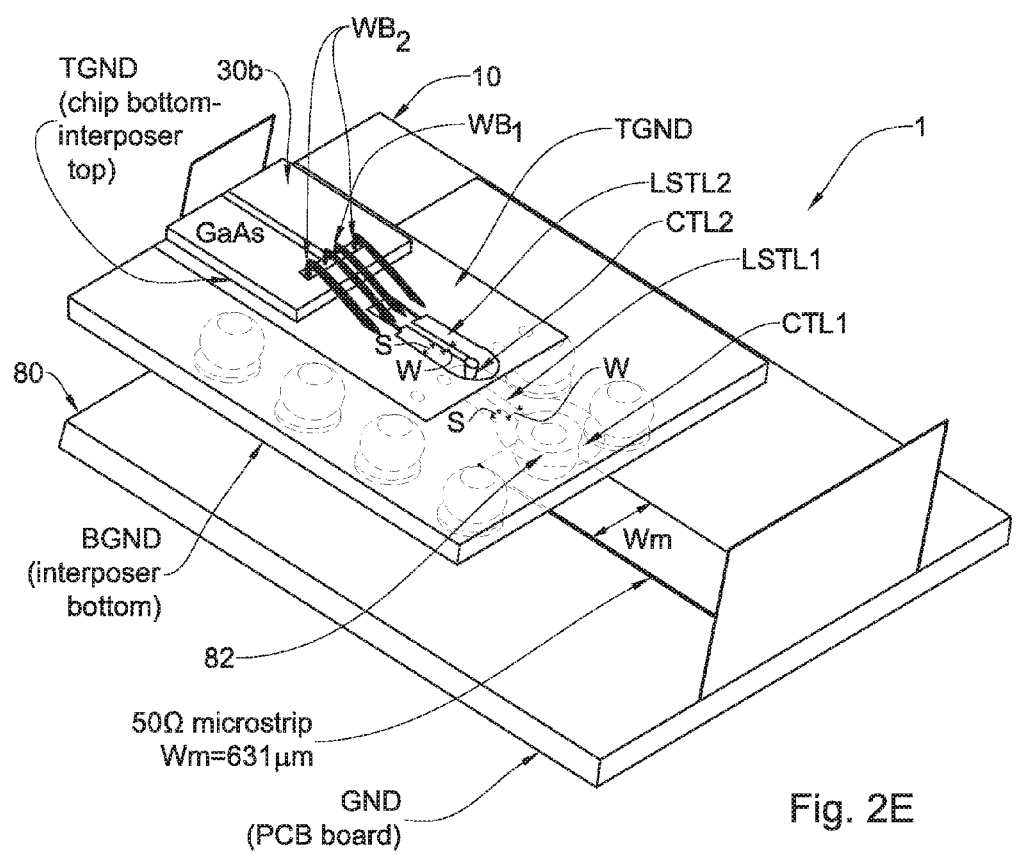

In the specific embodiment of FIGS. 2A to 2E, there are shown schematically specific illustrations of an integrated circuit device 1 according to the present invention in which the two or more active components 30 include a SiGe chip/die 30a and a GaAs chip/die 30b. FIG. 2A is a side cross-sectional view of the integrated circuit device 1. FIGS. 2B and 2C are respectively top views of the interposer structure 10 of device 1 without and with the active components 30a and 30b furnished thereon. FIG. 2D shows in more detail a side cross-sectional view of a part of interposer structure 10 including one TSV. FIG. 2E shows the active component 30b (e.g. being signal amplifier AMP) mounted on the interposer structure 10 and electrically connected thereto by impedance controlled wiring/transmission-lines. The impedance controlled transmission-lines are configured according to the present invention for allowing high frequency signals to/from active component 30b.

The integrated circuit device 1 of FIGS. 2A to 2E may be configured to allow proper operation of such components under extreme operational temperature conditions ranging between: −65° C. to 150° C. To this end, the interposer structure and the caps 40 are configured to provide sufficient mechanical stability and adequate coefficient of thermal expansion (CTE) of the interposer structure 10 and to allow carrying the active components 30 having sizes of about up to 25×25 mm while operating under the above extensive/extreme range thermal conditions.

Specifically, the thickness of the interposer substrate 12 of the interposer structure 10 as well as the arrangement and configurations of the vias 14 formed thereon are configured, as described in more detail below, for providing mechanical stability under extensive/extreme ranges of temperature conditions, as well as for providing sufficient heat conductance, allowing dissipation of heat from the active components under these conditions. To this end, the thickness of the interposer substrate 12 may be between 240-320 microns and the pitch of the vias at different regions of the interposer structure 10 is be selected to provide sufficient thermal conditions while compensating for CTE mismatch between the substrate 10 and active components furnished thereon. Further, as also illustrated in FIG. 1, the at least one cap 40 is coupled to the interposer structure 10 for reinforcing the mechanical stability of the structure 10 and additionally or alternatively for providing near hermetically sealed packaging for the active components 30 thus providing the packaging 2 which is suitable for operating the active components 30 under various humidity conditions.

To this end, referring together to FIGS. 1 and 2A to 2E, one or more of the following properties of the interposer structure 10 and the cap 40 are specifically designed and configured in order to prevent cracking and warping of the interposer structure and the active components carried thereby under a wide/extreme range of operational temperature conditions: For example:

- Material of the interposer substrate 12 is selected such that its CTE matches at least some of the active components 30.
- Material of the conductive vias 14 and their arrangement (e.g. diameters and pitches as well as the fraction of the area of a surface of the interposer structure covered by the conductive vias) is configured such that the effective CTE of the interposer structure 10 (including the substrate 10 and vias 14) substantially match those CTEs of the active components 30 to be carried by the interposer structure 10 at different regions thereof. To this end, different regions (e.g. R30a and R30b) of the interposer structure 10, which are associated with carrying different active components (30a and 30b) that have different CTEs, may be configured with different arrangements of conductive vias 14 and/or with different materials of the vias 14. This thereby enables mixed technology components to be mounted on the interposer, at different regions, allowing their operation under a wide/extreme range of temperatures.
- Thickness of the interposer substrate 12 is configured to allow some mismatch between CTE of the interposer substrate 12 and that of the vias and at least some of the active components 30 under a variety of temperature conditions. Specifically, the CTE of the interposer is properly configured by utilizing suitable configurations of the following parameters: Interposer and Vias materials (e.g. Si and Cu respectively), interposer thickness (e.g. 240-300 microns), vias diameter, RDL parameters, properties of a metal layer formed in said interposer structure, types of the active components, metal cap properties, and molding properties.
- Material composition as well as the shape (e.g. lateral and vertical dimensions and the thickness of the at least one cap 40) are configured and operable for enforcing the structural integrity and mechanical stability of the interposer structure 10 under various thermal conditions and to prevent warping and cracking of the structure 10. To this end, according to some embodiments of the invention the cap is made with sufficiently strong/flexible material compositions, such as metals, and with suitable shape and thickness to endure tensions/stresses affected between the boundary of the interposer structure 10 and the cap 40 under the thermal conditions for which operation of device 1 is sought.
- The cap(s) 40 is configured/made with material composition whose CTE is somewhat similar (e.g. is substantially equal) to the CTE of the vias' material 14. In some embodiments the cap 40 and vias 14 are made from the same or similar material compositions (e.g. from copper). In this connection, similarity between the CTEs of the cap 40 and vias 14 materials is considered relative to the CTE of the interposer substrate 12.

Thus according to specific embodiments of the present invention, such as that illustrated in FIGS. 2A to 2E, mixed technology components are used such as GaAs active component 30b and SiGe active component 30a. The interposer substrate 12 is selected to include or be formed by Silicon material (Si) while the conductive vias 14 and the cap 40 are formed with copper (Cu). In the following a self explanatory table describing the layer configuration of the interposer structure according to this embodiment is provided. Specifically, here the top/front surface of the silicon interposer substrate 12 is layered with layers 1 to 7 and the bottom/back surface is layered with layers 8 to 11.

|  | Level | Mask Name |
|---|---|---|
| Front-Side of the Interposer Structure | 1 | Alignment Key |
|  | 2 | True Silicon Via (TSV) Mask |
|  | 3 | TSV Passivation Opening |
|  | 4 | Die Pads |
|  | 5 | RDL, wire-bond pads and cap pads |
|  | 6 | Die, cap land pads and wire-bond pads opening |
|  | 7 | Pads finish |
| Back-Side of the Interposer Structure | 8 | Back-side TSV Passivation Opening |
|  | 9 | RDL and Ball-Grid-Array (BGA) pads |
|  | 10 | BGA pads Openings |
|  | 11 | Pads finish (e.g. under-bump-metallurgy ) |

Material composition and thickness of some elements/layers (i.e. vias, RDLs, front side passivation and die/wire-bond pads) of the interposer structure 10 is provided for example in a self explanatory manner in the table below:

| Item | Material | Thickness |
|---|---|---|
| TSV | Cu | 260-300 microns |
| Front side TSV passivation | SiN | 5 KA |
| RDL and die/wire-bond pads | Cu | ~5 microns |
| Pads Finish | DIG | 3 KA Au |

To this end, a thickness of the interposer structure 10 (and the depth of the vias 14) is selected in the range of about 200 to 300 microns such as to provide sufficient thickness for carrying the active components 30 while also being sufficiently thin and thereby sufficiently flexible to endure expansion mismatches (CTE mismatches) between the interposer substrate 12 and the vias 14 and/or other active components 30 and under wide (i.e. extensive) range of temperature conditions and/or under extreme temperature conditions.

The vias pitches P and possibly also vias diameters D and their shapes, may be configured differently at different regions of the interposer structure in order to provide, at the different regions, respectively different effective CTEs that substantially match the CTEs of the components 30 to be furnished at these regions. Indeed, in FIGS. 2A to 2E the active components 30a and 30b are configured with different technologies (SiGe and GaAs respectively) and thus different pitches ($P_{SiGe}$ and $P_{GaAs}$) of the vias 12 are provided at respective regions R30a and R30b at which the components should be mounted (e.g. in the vicinity and/or beneath the locations of components 30a and 30b). Specifically, in the region R30b near/beneath the GaAs component 30b, the vias' pitch is in the order of $P_{GaAs}$=200 microns and in the region R30a, near/beneath the near/beneath the SiGe component 30a, the vias pitch is in the order $P_{SiGe}$=300 microns. As will be further described below, this provides that the respective effective CTEs $E_{CTE-SiGe}$ and $E_{CTE-GaAs}$ of regions R30a and R30b substantially match the CTEs of the respective components 30a and 30b that are to be mounted at these regions. The vias are, in this example, tapered vias with via diameters being $D_f$=~100 microns near the top surface of the interposer substrate 12 and $D_t$=~50 microns near the bottom surface. Detailed illustration of the configuration of such a conductive via accommodated in the interposer structure 10 is provided in FIG. 2D.

In the following, simplified calculation of the average CTF of the interposer structure 10 is provided to illustrate how arrangements of vias (e.g. arrangement of the different vias' pitches P and/or with different diameters D) may be used to provide different effective CTEs at different regions of the interposer structure 10. In this connection it is noted that the following calculation is based on averaging of the thermal coefficients of the different material of vias 14 and interposer substrate 12. In this regard the calculation provided below provides an estimation of the effective CTEs resulting from certain vias pitch and diameter allowing assessing the compatibility of the resulting effective CTEs with certain technology and/or type of active component. It is understood that this estimation is provided for illustration purposes and that a person of ordinary skill in the art, knowing the invention, would readily appreciate how to perform more accurate calculations and/or simulation which may take into account additional parameters of the technologies and/or material used, such as the forces/tension discharged by different materials (e.g. the Si and Cu materials of the substrate and vias respectively) when subjected to thermal expansion.

Thus considering an arrangement of the N×M vias on a region of the interposer structure 10 the net area of the vias is: Area Vias: $A_{vias} = N*M*\pi*D^2/4$; the total area of the region of the interposer is: Area total: $A_{tot} = N*M*P^2$; and the net area of the interposer substrate is: Area Subs: $A_{subs} = k_{tot} - A_{vias}$. Therefore, the effective CTE $E_{CTE}$ of the interposer structure in such a region would be about the mean (e.g. weighted mean) of the CTEs of the materials of the substrate 12 and vias 14, in accordance with respective areas they occupy in the structure 10.

$$E_{CTE} = \sim (CTE_{vias} * A_{vias} + CTE_{subs} * A_{subs})/A_{tot} =$$
$$= CTE_{subs} + (CTE_{vias} - CTE_{subs}) * \pi * D^2 / (4P^2).$$

Therefore in the example of FIG. 2 above in which at the region of the GaAs component 30b the vias pitch is $P_{GaAs} = 200$ microns and at the region of the SiGe component 30a the vias pitch is $P_{SiGe} = 300$ microns and where the top surface diameter of the vias is $D_t = 100$ microns, the effective coefficients of thermal expansion $E_{CTE-GaAs}$ and $E_{CTE-SiGe}$ that are provided by such an arrangements in the respective regions R30b and R30a of components 30b and 30a are respectively estimated to be about:

$E_{CTE-GaAs} = 10^{-6} \times [2.6 + (16-2.6)*\pi*100^2/(4*200^2)]$
   $= 5.23 \times 10^{-6}$ °C.$^{-1}$.

$E_{CTE-SiGe} = 10^{-6} \times [2.6 + (16-2.6)*\pi*100^2/(4*300^2)]$
   $= 3.77 \times 10^{-6}$ °C.$^{-1}$.

The above calculation is made considering the CTEs provided in the table below for the Si material of the substrate 12 and the conductive Cu material of the vias 14. Evidently the calculated effective coefficients of thermal expansion $E_{CTE-GaAs}$ and $E_{CTE-SiGe}$ approach the CTEs of the respective components 30b and 30a carried by the interposer structure in the corresponding regions as can be seen from the CTE table below:

| | CTE [° C.$^{-1}$] | | | |
|---|---|---|---|---|
| | $CTE_{subs}$ ->Si | $CTE_{vias}$ ->Cu | SiGe | GaAs |
| ΔL/(LΔT) | $2.8 \times 10^{-6}$ | $\sim 17 \times 10^{-6}$ | $\sim(3.4) \times 10^{-6}$ | $6.5 \times 10^{-6}$ |

To this end for example, the CTE of a interposer structure including Silicon substrate with Copper vias implemented in 11% of its surface area is about $4.36 \times 10^{-6}$.

Indeed, in some cases there still remains some mismatch between the CTEs of the active components and 30b and 30a and the effective CTEs of the respective regions of the interposer structure 10 onto which these components 30b and 30a are mounted. According to some embodiments, a bonding material 32, which is used for furnishing one or more of the active components 30b and 30a on the interposer structure, is selected to have a sufficient degree of flexibility/elasticity for reducing stresses which may occur under different temperature conditions due to the mismatch/difference in coefficients of thermal expansion between the active components 30 (e.g. 30a and 30b) and corresponding regions (e.g. R30a and R30b) of the interposer structure 10. Specifically in some embodiments, such as that of FIGS. 2A to 2E, a bonding material is used to thereby provide sufficient degree of flexibility/elasticity. For example commercially available bonding materials such as Abletherm® 2600 and/or QM529HT may be used to provide 10-18 MegaPascal binding and maximum warpage of about 67 micro meters.

Indeed, the thermal coefficients of the interposer substrate 12 (e.g. Si in FIG. 2) and the vias 14 conductive material (e.g. Cu in FIG. 2) may be substantially different and thus according to some embodiments of the invention sufficiently small via diameters are utilized in order to prevent/reduce structural damages and/or warping of the interposer substrate 12 when the interposer structure 10 is subjected to extensive temperature variations. To this end, according to some embodiments, the vias are tapered such that their upper/top surface diameters $D_t$ (the diameters near surface S1) are sufficient to provide the desired effective coefficient (s) of thermal expansion at one or more regions of the interposer structure 10 near that surface S1. On the other hand, the bottom surface diameters $D_b$ of the vias are made smaller to reduce the amount of vias's conductive material embedded in the interposer substrate 12 thus reducing and/or preventing structural damages to the interposer structure 10 while it is subjected to a wide range of temperatures. For example the top surface diameters $D_t$ of the vias may be in the order of 80 to 100 microns and the bottom surface diameters $D_b$ about 50 microns, or both top and bottom diameters may be about $D_t = D_b = 60$ microns. In this connection it is noted that in some cases, due for example to differences of the effective CTE at different regions of the interposer structure 10 (e.g. difference between $E_{CTE-GaAs}$ at the region of the structure 10 carrying component 30b and $E_{CTE-SiGe}$ at the region of the structure 10 carrying component 30a), warping and/or cracking of the interposer structure 10 and or active components 30 thereon might occur when the substrate is subjected to a wide range of varying temperature conditions. Therefore according to some embodiments of the invention, in order to prevent/reduce such warping and cracking, the cap 40 is provided, attached to the top surface S1 of the interposer structure 10, and configured to reinforce the interposer structure 10. Specifically, following the example above, the cap 40 material may be copper, similar to that of the conductive vias 14 and may be 400 to 500 microns thick to provide sufficient reinforcement and mechanical stability to interposer structure 10. Alternatively or additionally, a similar mechanical stability may also be achieved by utilizing a stainless steel cap 40 with thickness in the range of 300 to 400 microns. As noted above, according to some embodiments, the material of the metal cap 40 is similar to that of the conductive vias thus having similar CTE and providing balanced reinforcement to the interposer in an extensive/extreme range of temperatures. One more consideration in selecting the material of the cap is the effect of the molding process (e.g. in high pressures/temperatures) on the cap warpage of the cap. To this end, the structural form of a stainless steel cap is typically less susceptible to warpage due to high pressure and/or high temperature process (e.g. as in a molding process).

Considering conventional packaging techniques, active component(s) are generally directly covered by a molding layer which is typically made of polymer or other porous dielectric materials. Directly covering the active components by molding layers does generally not provide sufficient humidity sealing and a packaging obtained by such techniques is thus not suitable for operation of the active component 30 under various/extreme humidity conditions.

Some embodiments of the invention are directed to provide hermetic or near hermetic sealing for humidity and thus allow operation of the active components 30 under various and/or extreme humidity conditions. Specifically, according to some embodiments of the present invention the packaging is configured for providing fine leak type sealing which is aimed at providing failure free operation of the system for 1000 hours in 85% humidity conditions and at temperatures of 85° C. According to such embodiments, the cap 40 is made of non porous material (e.g. from metal) which is sealed for humidity (e.g. preventing propagation of water molecules therethrough the material) and is configured for encapsulating one or more of the active components in between the cap 40 and the interposer structure 10 to thereby provide the near hermetically sealed packaging for the encapsulated one or more active components. In some cases each of the active components is encapsulated in between such cap 40 and the interposer structure 10.

Indeed, in some embodiments a cavity 45 is defined between the cap 40 and the interposer structure 10. The cavity 45 may exist in vacuum conditions or filled with gas (e.g. air and/or other gas(es) such as inert gases). In the latter case, the cap 40 is configured with one or more vent openings 42 defined thereon in order to prevent and/or at least reduce build up of pressure in the cavity 45 under varying temperature conditions.

In embodiments where the one or more vents 42 are defined, and in cases where provision of near hermetically sealed packaging is sought (e.g. usable for extreme humidity conditions), the integrated circuit device 1 preferably includes a mold layer 50 which is arranged for covering the top surface of the interposer structure with the two or more active components and the cap(s). The mold layer 50, is configured for covering the cap 40 with the one or more vents 42 to thereby restrict the amount of humidity which can pass through the vents 42 and provide near hermetically sealed packaging. In this connection it should be understood that although the mold layer 50 may include conventional mold materials, which may be by themselves porous materials allowing some penetration of humidity, the combination of the mold 50 and the cap 40 provides a near hermetically sealed solution. This is at least because the cap's 40 material is non-penetratable for humidity and the vent 42 openings in the cap 40 are relatively small as compared with the entire cap 40 surface area and as the vents are entirely covered by the mold layer 50, and thus the amount of humidity that can penetrate therethrough is negligible. In this regard, it should also be understood that although the mold material 50 over the vent(s) 42 substantially restricts/reduces penetration humidity, it still allows passage of gas molecules through the vent(s) 42 and thus enables the proper functioning of the vents 42 for balancing the pressure in the cavity 45 and preventing/reducing pressure buildup therein.

As noted above, the technique of the present invention provides a packaging substrate for two or more different components, which are manufactured by different semiconductor technologies (different semiconductor material compositions). The mounting of one or more of the components may be based on wafer level packaging techniques. To this end, the two or more different components are furnished-on/carried-by the common interposer structure 10 and are integrated, e.g. fully or partially electrically interconnected with one another, via electric connections implemented by one or more RDLs (e.g. 20 and/or 60) of the interposer structure 10. The embodiment of the present invention illustrated in FIGS. 2A to 2E in which in the integrated circuit device 1 includes a first active component 30a is a signal processing unit (SPU e.g. processor) configured with SiGe technology and a second active component 30b is a signal amplifier (AMP) configured with GaAs technology. The SPU active component 30a and the AMP active component 30b are integrated and packaged together, being installed and carried on the common interposer structure 10 and electrically interconnected with one other via electric interconnection routed in the RDLs (20 and/or 60) of the interposer structure 10. To this end, FIGS. 2A to 2E illustrate a SIP including two active components 30a and 30b fabricated with different semiconductor technologies.

In this specific example, the SPU 30a and the AMP 30b components are high frequency components which are configured and operable for respectively processing and amplifying high frequency signals in the RF frequencies of the order of ten to twenty GHz (e.g. 12 GHz). Packaging together and/or integration of such high frequency components is associated with several difficulties which are solved by the technique of the present invention. For example:

Accommodation of electric circuitry/chips, such as high power chips and signal amplifiers (e.g. AMP component 30b), associated with significant/relatively-high thermal emission, require that the integrated circuit device 1 provides good thermal coupling between such components and the environment to allow sufficient heat evacuation from at least some regions of such components.

As high frequency signals are transferred/conducted between the SPU 30a and the AMP 30b, sufficient electromagnetic masking and controlled dielectric environment should be provided in the vicinity of those components to allow their proper operation and impedance controlled transmission lines/wires should be used to provide interconnections between those components. In this connection, in order to provide a controlled dielectric environment for the active components, dielectric materials, which were not considered to be in the vicinity of the components during the design of such components should be masked and/or located at sufficient distance from the components. As most components are typically designed considering an air, vacuum and/or inert-gas environment in their vicinity, other dielectric materials, such as the molding material, which has different dielectric properties, are arranged according to the invention, at sufficient distances from such components (e.g. by utilizing proper configuration of the metal cap). In this connection the interposer structure 10 of the integrated circuit device 1 of the present invention (e.g. of FIGS. 1 and/or 2) may be configured according to some embodiments with sufficiently thin interposer substrate 12 formed with material(s) having relatively high thermal conductivity to thereby enable sufficient heat evacuation from active components mounted on the interposer structure 10. Specifically, the thickness of the interposer substrate 12 in the embodiment of FIG. 2A to 2E is in the range of 200 to 300 microns and the substrate 12 is formed of silicon material which is associated with good thermal conductivity. Additionally, the material of the conductive vias 14 of the interposer structure 10 may be selected according to the present invention to provide significant improvement to the thermal conductivity of the interposer structure 10. This is achieved by utilizing the vias 14 formed with material having relatively high thermal conductivity (higher than that of the interposer substrate) thereby further improving heat evacuation from active components mounted on the interposer structure 10.

Yet, further improvement to the ability of the device 1 to diffuse heat from highly thermally emissive active components, or from certain regions thereof, is achieved by configuring the sizes and the locations of at least some of the vias in accordance with the regions at which high thermal emissions are expected from the active components 30 carried/mounted on the interposer structure 10. Specifically, considering the type and/or internal structure of at least one highly thermally emissive active component (e.g. of AMP 30b), certain regions/features in the internal pattern/structure of such components may be associated with particularly significant thermal emission during the component's operation. To this end, according to the present invention the location of at least one or more of the vias 14 are configured to lie beneath such thermally emissive features/regions in the component's structure to thereby provide good thermal coupling of these features regions with the vias material. Additionally, and also in consideration of the maximum possible via size allowing mechanical and structural integrity to the interposer structure 10, the sizes of the vias are also configured to be of the order of, or greater than, the characteristic size(s) of the thermally emissive features/regions in the component's structure to thereby further improve thermal coupling of these features with the vias material. Since typically the vias are associated with material having thermal conductivity higher than that of the interposer substrate 12, such arrangement of the location and possibly sizes of the vias (or some of them) may greatly improve the ability of the device 1 to diffuse heat from the active components 30 even during operation of highly thermally emissive component under extreme/high temperatures conditions.

Specifically in the embodiments of FIGS. 2A to 2E, pattern features of signal amplifier (AMP) component 30b are associated with substantial heat emission during operation. Features of the AMP component 30b are typically configured with the shape of substantially parallel ridges/fingers of a width of about 60 microns. As such ridge features are associated with most of the heat emission of the signal amplifier (AMP) component 30b, the locations and diameters of at least some of the conductive vias 14 of the interposer structure 10 are configured respectively according to the locations and widths of the ridge features of the AMP component 30b when the latter is mounted on the interposer structure. This thereby provides optimal thermal coupling with these ridge features and allows diffusing heat therefrom. In this regard, it is noted that the SPU component 30b in this example is associated with lower thermal emission and thus vias 14 that are associated therewith (located beneath it when it is mounted on the interposer 10) are not necessarily configured to be thermally coupled with specific features of the SPU 30a.

Turning now to FIG. 2E, a part of the integrated circuit device 1, at which high frequency AMP component 30b is mounted, is illustrated schematically. Specifically FIG. 2E shows in more detail a configuration of the wiring/transmission-lines in the device 1 which is configured and operable to allow packaging of the AMP component 30b (e.g. utilizing wafer level packaging techniques or other techniques) while providing improved insertion and transmission losses in the signals communicated to and/or from the AMP component 30b. Specifically, the AMP component 30b in the present example is associated with signal and ground ports, $P_s$ and $P_g$ through which high frequency (e.g. RF signals of up to 10 to 20 GHz) signals are communicated to/from the AMP component 30b. In order to improve the insertion and/or transmission losses in the signal communicated to the AMP component 30b, impedance controlled configuration of transmission lines/wiring is used in the interposer structure 10 (e.g. substantially balanced transmission configuration). This is achieved in the present invention by configuring the location and arrangement of the wiring through the interposer structure with a combination of two or more impedance controlled transmission schemes which may include for example any two or more of the following: coaxial, micro-strip, lateral strip (i.e. a co-planar waveguide configuration), use of wire bonds, spacing between conductors and the conductors natural capacitance for matching, furthermore using the balls of the BGA and the TSV at a specific size and position to allow perfect matching transmission schemes.

Specifically, in the present example a substantially balanced transmission line is lead from the PCB 80 on which device 1 is mounted, through the interposer structure 10, to the AMP component 30b which is mounted on the interposer structure 10. In the present example the transmission line passing through the device 1 includes:

(i) a first coaxial transmission line CTL1 configuration leading vertically from the PCB 80 to the interposer structure 10 and formed with one of the wafer bumping 82 in association with a back side conductive plate/layer BGND specifically shaped in the bottom side of the interposer structure 10 to define coaxial contour of about the wafer bumping 82. In operation the conductive plate BGND is grounded while the wafer bumping 82 serves as the signal line thus providing substantially coaxial transmission line between the PCB 80 and the interposer 10.

(ii) a first "lateral-strip" transmission line LSTL1 arranged at the bottom side of the interposer 10 and leading horizontally from the first coaxial transmission line CTL1 towards a second coaxial transmission line CTL2 which passes through the interposer 10 from its bottom side to its top side. The "lateral-strip" transmission line LSTL1 includes a signal line of width W with two regions of the back side conductive plate/layer BGND arranged from both its sides and separated therefrom by a width S.

(iii) a second coaxial transmission line CTL2 configuration leading vertically through the substrate 12 of the interposer structure 10 and formed with one 14a of the conductive vias 14 and in association with a top conductive plate/layer TGND plane provided at the top side of the interposer 10 and shaped to define a coaxial contour of about the conductive via 14a. In operation the conductive plate TGND is grounded while the conductive via 14a serves as the signal line thus providing substantially coaxial transmission line passing through the interposer 10.

(iv) a second "lateral-strip" transmission line LSTL2 arranged at the top side of the interposer 10 and leading horizontally from the second coaxial transmission line CTL2 towards the AMP component 30b. Similarly to the first "lateral-strip" transmission line LSTL1 also the second "lateral-strip" transmission line LSTL2 includes a signal line of width W with two regions of conductive plate/layer arranged from both its sides and separated therefrom by a width S. Here, the regions conductive plate/layer being the regions of the top side conductive plate/layer TGND.

(v) wire bonding transmission line WBTL including two pairs of 2 mil diameter wirebond connections, a first pair WB1 of bond wires are configured in double bond configuration for signal transmission and connected between the "lateral-strip" transmission line LSTL and the AMP component 30b, and a second pair of wire bonding connections WB2 including two bond wires arranged laterally, from either side of the first pair WB1 of bond wires, substantially parallel thereto, and are connected between the grounded top conductive layer/plate TGND and the AMP component 30b.

Such configuration of the transmission line in the interposer structure 10 provides providing RF connection for the active component 30b allowing transmission of frequencies up to 20 GHz. More specifically, the configuration of the transmission line described above provides insertion losses S12 not exceeding +0.2 dB for high frequencies of about 10 GHz and return losses S11 and S22 not exceeding −20 dB high for frequencies of 10 GHz. In this connection it should be noted that the return losses S11 and S22 are respectively associated with the Chip-side (Active-component side) and PCB-Side return losses.

Figure 2F:
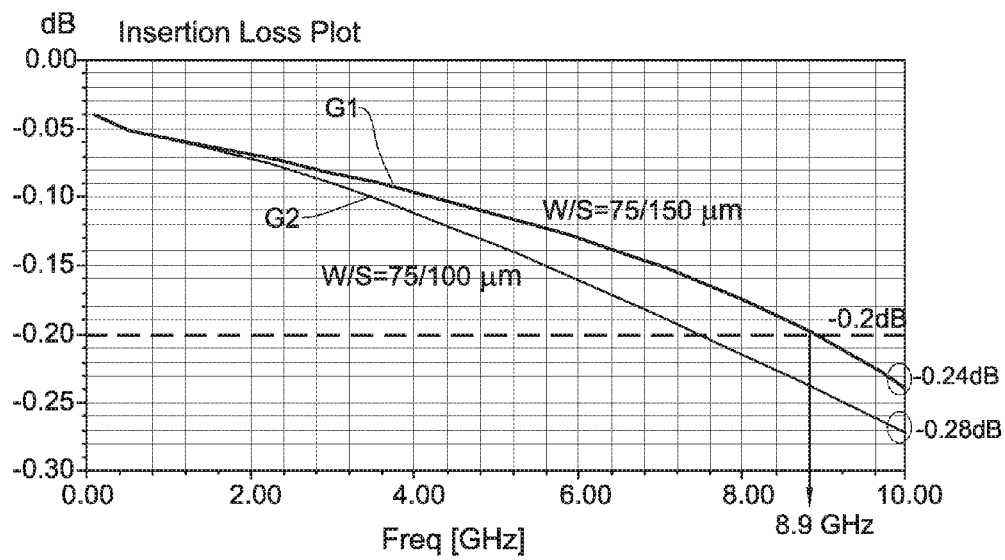
FIGS. 2F and 2G are graphs, respectively illustrating the insertion losses (S12) and return losses (S11 and S22) as functions of the signal frequency of the components illustrated in FIG. 2E.
Figure 2G:
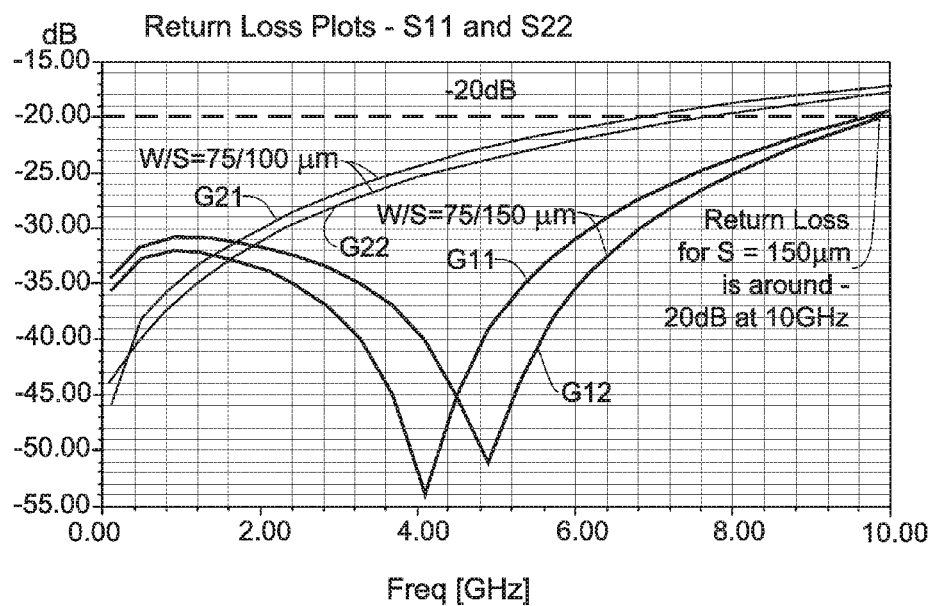

FIGS. 2F and 2G show graphs illustrating the insertion losses (S12) and return losses (S11 and S22) as functions of the signal frequency. Specifically, FIG. 2F showing the insertion loss as those losses are obtained by two embodiments of the transmission line configuration described above. Specifically, FIG. 2F shows graphs G1 and G2 of the insertion loss S12 obtained for two embodiments of the transmission line above. In the first embodiment (graph G1) the first and second lateral strips, LSTL1 and LSTL2, are configured with the signal line width W=75 microns and with the separation width S=150 microns. In the second embodiment (graph G2) the first and second lateral strips, LSTL1 and LSTL1, are configured with the signal line width W=75 microns and with the separation width S=100 microns. FIG. 2G shows four graphs G11, G12, G21 and G22 wherein graphs G11 and G12 respectively show the return losses S11 and S22 for the first embodiment of W=75 microns and S=150 microns and graphs G21 and G22 respectively show the return losses S11 and S22 for the second embodiment of W=75 microns and S=100 microns.

Typically high frequency active components/chips are designed to operate in environments such as air or vacuum and accordingly impedances of features/electrical-structures in such components are designed considering the permittivity of such air or vacuum environments. Operating such high frequency components in the vicinity of materials associated with permittivities different than that of air/vacuum might potentially impair proper operation of the high frequency active components/chips.

To this end, to allow proper operation of high frequency active components/chips such as AMP 30b, the present invention provides a packaging technique allowing to electromagnetically mask these components from other materials in their vicinity (e.g. such as the dielectric material of the mold layer 50) which may be associated with permittivities that are substantially different than that of air/vacuum. In this connection the cap 40 may be formed of conductive material(s) (e.g. metals such as copper) and may be configured to encapsulate the high frequency active components (AMP) 30b such that the component's operational characteristics (e.g. its associated insertion and/or transmission losses), are substantially not impaired by the presence of said other dielectric materials.

Specifically in some embodiments the shape(s) of the conductive/metal cap(s) 40 is configured to define a cavity between the cap(s) 40 and the high frequency active components AMP 30b encapsulated thereby, whereby the cavity provides sufficient gap allowing to electromagnetically mask from the active component 30b other materials residing outside the cap(s) 40. Specifically in embodiments of the invention in which mold layer 50 is formed on top of the cap 40 with dielectric material, the cap is designed to provide sufficient gap between the mold layer 50 and the high frequency active components 30b. Typically, sufficient gap is particularly provided with respect to the vertical/height direction/axis between the active component 30b and the material of the mold layer 50. The cavity 45 is thus vacuum or air-filled such that electrical impedance of one or more of the active components 30 is substantially not affected by the presence of the mold material or other dielectrics thereby materials thereby facilitating proper operation of the one or more of said active components.

Figure 3A:
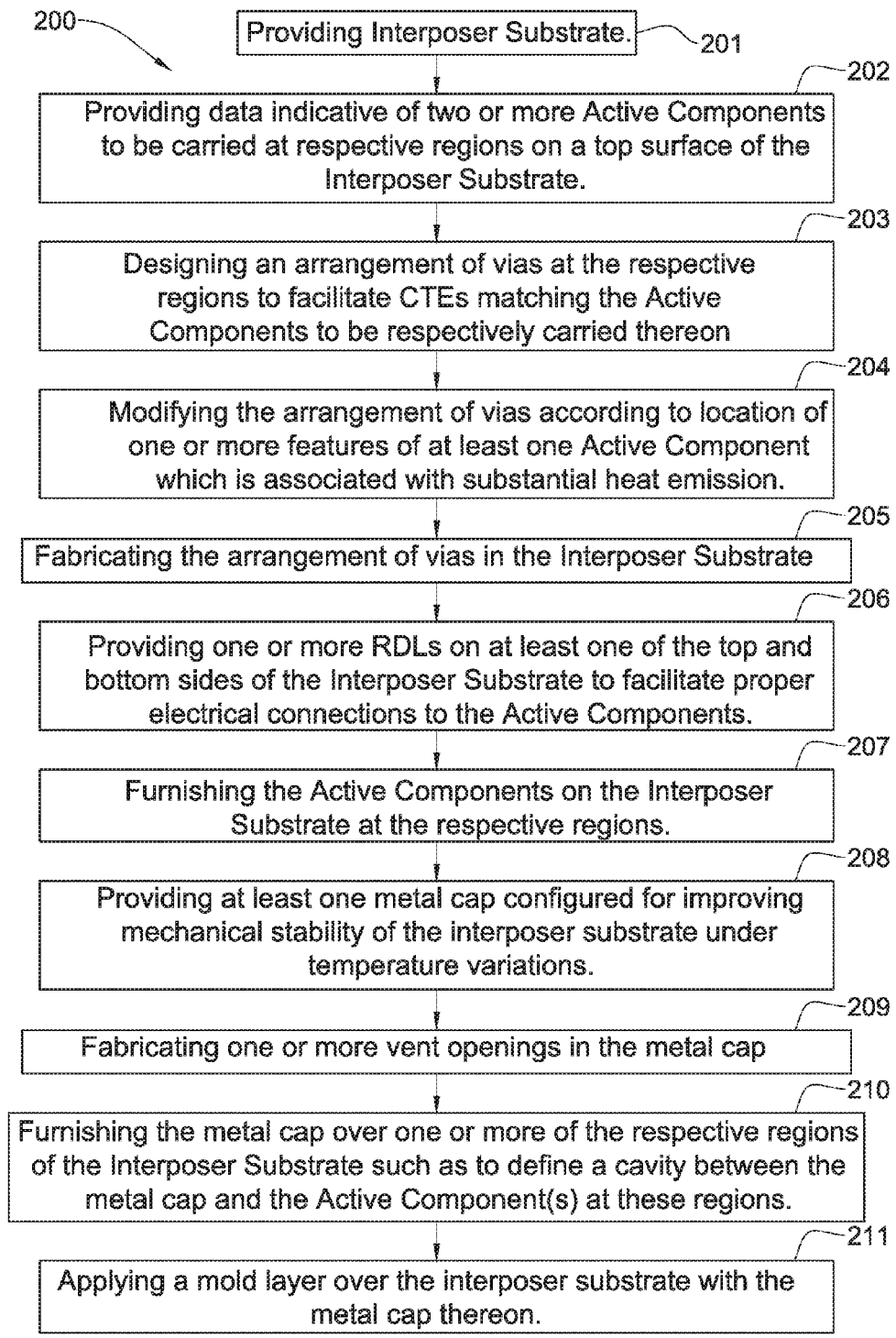
FIG. 3A is a flow diagram illustrating a method according to the present invention for fabricating an integrated electronic device.

Reference is made to FIG. 3A which is a flow diagram illustrating method 200 for designing and fabricating the integrated electronic device, such as device 1 of FIG. 1, according to some embodiments of the present invention. Method 200 includes the method steps 201 to 211 which may be carried out in any suitable/applicable design and thus an integrated electronic device may be fabricated according to the invention.

In 201 an interposer substrate is provided. The interposer substrate material properties such as material composition and thickness are selected according to the desired mechanical stability, coefficients of thermal expansion and heat conductance to be obtained in an interposer structure to fabricated therefrom by the following steps 202 to 206. In some embodiments of the invention silicon substrate of thickness in the order of 200 to 300 microns is selected.

In 202 data indicative of properties of the two or more active components to be carried at respective regions on a top surface of the interposer substrate (e.g. top surface of the interposer structure fabricated therefrom) are provided. The data is typically indicative of the arrangement of electrical connections in the active components, their respective CTEs (e.g. the respective semiconductor technologies used for their fabrication), and their operation characteristics power consumption and/or heat emission during operation. An arrangement of vias is designed in 203 based on the properties of the active components to be carried at different respective regions of the interposer substrate. The arrangement of vias (their locations, pitch between them and their characteristic sizes/diameters and shapes) are designed in the manner described above for providing at the different regions, CTEs substantially matching the CTEs of the active components to be respectively carried thereon. This facilitates operation of the device of the present invention under a wide range of temperatures without affecting the structural integrity of the device and either one of the interposer structure and components carried thereon. In optional step 204, the arrangement of vias is further designed/modified in accordance with the location and sizes of specific features on the active components which are associated with substantial heat emission during operation. Specifically, as the vias' material is typically associated with heat conductivity greater than that of the interposer substrate, the locations and sizes of one or more of the vias are preferably configured to enable good thermal coupling between these vias and the specific features of the active components such as to enable a sufficient degree of heat diffusion from those features during operation of the integrated device. In this connection, it should be understood that in some embodiments of the present invention, steps 203 and 204 are performed together for designing the vias arrangement.

Figure 3B:
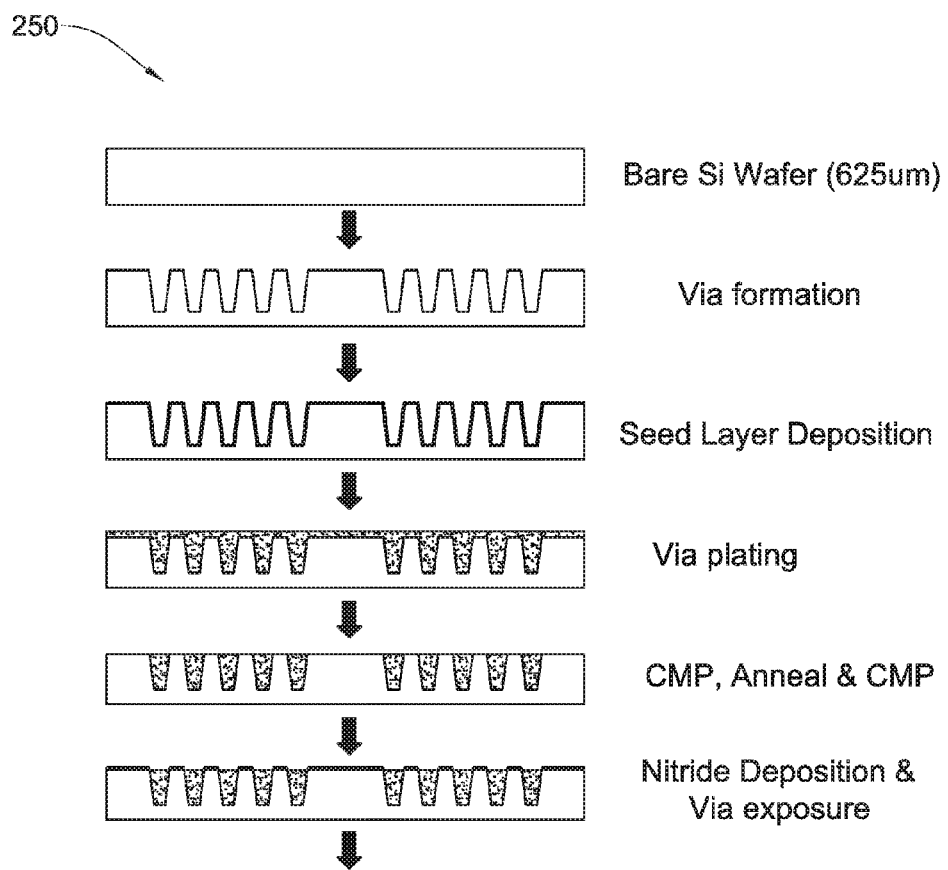
FIGS. 3B to 3D are flow charts illustrating in detail and in a self explanatory manner SIP fabrication methods which are carried out according to some embodiments of the invention for fabricating an integrated electronic device.

In 205 the arrangement of vias is fabricated on the interposer substrate. FIG. 3B shows in more detail a method for fabricating the vias arrangement according to an embodiment of the present invention.

Figure 3C:
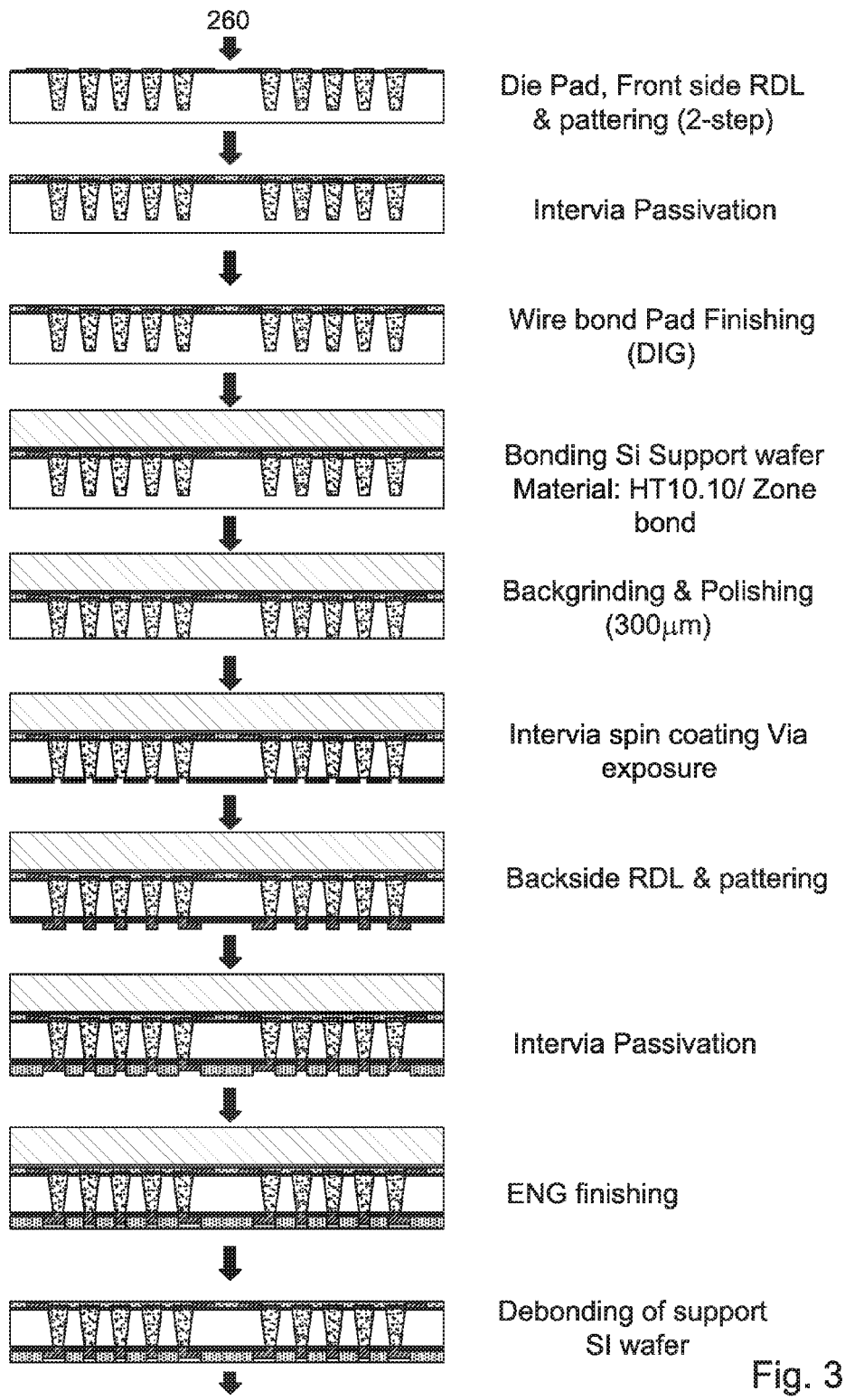

In 206 electrical connections are fabricated on the interposer substrate in accordance with the electrical connections of the two or more active components. Specifically, one or more RDLs are provided on at least one of the top and bottom sides of the interposer substrate to facilitate proper electrical connections to the Active components. FIG. 3C shows in more detail a method for fabricating RDLs on the interposer structure according to some embodiments of the present invention.

In 207 the active components are furnished on the interposer substrate (e.g. on a top surface thereof) at their respective regions. The active components are typically attached utilizing a bonding material paste/glue that is selected with sufficient elasticity providing tolerance to some mismatch between the effective CTEs of the interposer structure and the CTEs of the active components at the respective regions the active components are installed.

In 208 at least one metal cap is provided, configured for improving mechanical stability of the interposer substrate under temperature variations. The metal cap shape and thickness are designed to reinforce the interposer substrate preventing or reducing cracking and/or warping of the interposer substrate and active components thereon under a selected/wide range of temperature conditions. Also, according to some embodiments of the present invention the metal cap is formed of conductive material and is configured to define a cavity surrounding one or more of the active components (specifically from their top/upper side) such that it provides electro-magnetic shielding/masking for these active components. Such a cavity may be configured to provide impedance controlled environment and allow normal operation of high frequency components in the vicinity of dielectric material such as a molding layer which may be used for encasing and/or encapsulating the integrated electronic device of the present invention. In 209 one or more vent openings are fabricated in the metal cap allowing pressure balancing in the cavity during temperature variations thereby enabling operation of the integrated electronic device under varying temperature conditions.

In 210 the metal cap is furnished on the interposer substrate/structure, being attached thereto utilizing suitable binding material (paste/glue). The metal cap thereby defining the cavity noted above.

Then, optionally, in step 211, final encasing of the device of the present invention is provided by applying a mold layer over the top surface of the interposer structure with the active components and metal cap furnished thereon. In this connection a method for the formation of the mold layer is provided according to the present invention. In some cases, conventional techniques for application of a mold layer might inflict damage to elements of the integrated circuit device 1 of the invention and specifically may damage the active components 30 and/or the interposer structure 10, causing warping/cracking of the cap 40, and/or impairing the mechanical stability attained in the interface between such components when mounting the components on the substrate utilizing the technique of invention. For example the mechanical stability may be impaired due to some mismatch between the CTEs of the substrate and the components and due to temperatures associated with the molding process. Therefore, according to some embodiments of the present invention, a novel technique is utilized for implementing the molding layer to the integrated circuit device 1 without inflicting damage to either one of the metal cap, the active component and their mounting to the interposer. This method is described in more detail below with reference to FIGS. 4A to 4D.

Figure 3D:
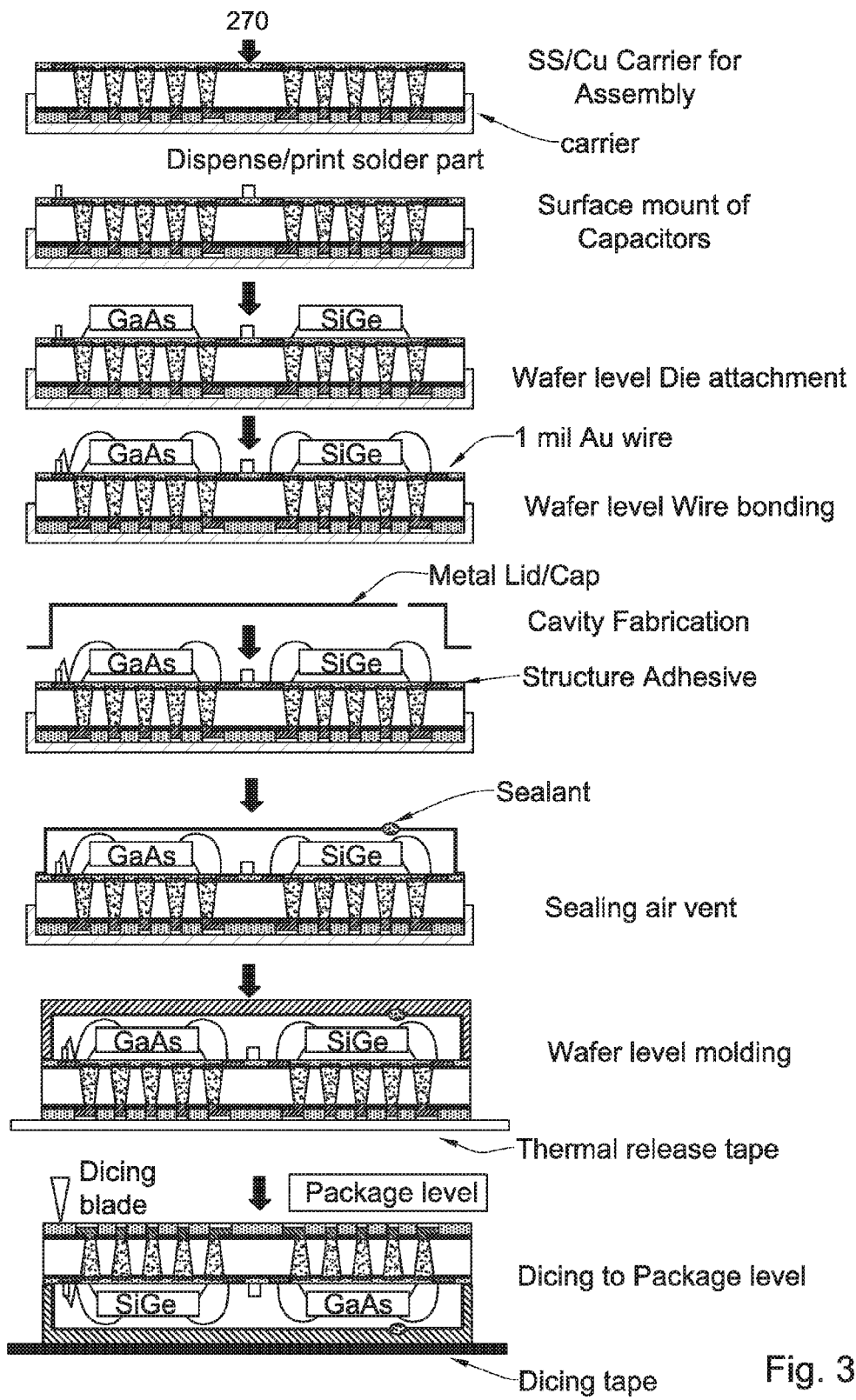

FIGS. 3B to 3D show flow charts 250, 260 and 270 which respectively illustrate in a self explanatory manner the SIP fabrication methods according to some embodiments of the present invention. The methods illustrated in 250, 260 and 270 may be carried out consecutively to fabricate a system in package. Specifically: method 250 includes method operations carried out for fabricating vias in an interposer substrate; method 260 includes method operations carried out for fabricating RDL(s) on the interposer substrate to thereby form an interposer structure; and method 270 includes method operations carried out for furnishing active-components/dies on the interposer structure and encapsulating and sealing the active components. Actually, method 270 is a detailed embodiment of operations 207 to 211 in method 200 described above.

Reference is now made to FIG. 3B which is a flow chart showing in more detail a method for fabricating the vias arrangement according to an embodiment of the present invention. The method includes providing a bare wafer (e.g. a silicon wafer) as the substrate for the interposer 10. The vias are formed with a predetermined arrangement (e.g. pitch and location), according to size and shape of the vias at different regions of the wafer. The arrangement, size and shape of the vias at different locations of the wafer are selected to provide CTEs matching to the respective CTEs of active components to be carried by the interposer at said different locations, and also to provide sufficient thermal conductance to allow sufficient heat evacuation from certain components (e.g. for components associated with high power operation). Then a seed layer is deposited on a surface of the wafer and the vias. The vias are then plated/filled with a material such as copper. Residual plating material left on the wafer is then cleared by utilizing chemical-mechanical polishing (CMP) and/or by combination of annealing and CMP. Finally the filled vias are exposed utilizing Nitride deposition.

Reference is made to FIG. 3C, which is a flow chart 260 showing in more detail a method for fabricating top and bottom RDL layers on an interposer substrate. The process 260 may typically be carried out following the formation of vias in the substrate, for example as shown in method 250. The method 260, includes implementing die pads and RDL layers on the front (top) side of the interposer structure, applying inter-via passivation on the front side of the interposer structure and applying wirebond finishing. Then the interposer structure is bonded from its top side to a support wafer (for example from silicon) to facilitate processing of the back (bottom) side of the interposer structure. The back side is grinded and/or polished. RDL layers are then provided on the back side of the interposer structure, inter-via passivation is applied and the interposer structure is detached from the support wafer. It should be noted that although in method 260 both front- and back-side RDLs are fabricated, the invention may generally be carried out utilizing RDL layers fabricated from only one side of the interposer structure.

Reference is made to FIG. 3D, which is a flow chart 270 showing in more detail a method for a SIP fabrication method/process according to some embodiments of the present invention. Specifically, flowchart 270 shows the furnishing and sealing of the active components on an interposer structure configured according to the present invention (for example on an interposer structure fabricated in accordance with method 260 above). It should be noted that although here the active components are not formed as an integral part of the interposer structure (i.e. they are not fabricated directly on the interposer), in other embodiments of the present invention a similar fabrication method may be carried also when one or more of the active components are carried by the interposer as an integral part thereof (namely, in cases where active component(s) are fabricated directly on the interposer).

Method 270 includes attaching the interposer structure on a carrier facilitating assembly of the active components on the interposer. Optionally, capacitors are surface mounted on the interposer structure. Then active components (dies) are attached to the top side of the interposer at their respective locations (e.g. die pads) and electrically connected (for example via wafer level wire bonding). A cap (e.g. metal cap) defining the cavity encapsulating the active component (s) and having an air-vent, is provided. The cap is attached to the interposer structure from the upper side, at the proper location by utilizing a structural adhesive. The air vent is then sealed by proper sealant, preventing and/or reducing humidity entrance to the cavity while allowing pressure release from the cavity. Then, molding is applied to the interposer structure with the cap thereon to improve the package sealing. Finally the interposer structure is diced to package level to form one or more SIPs. To finalize the process, package level solder balls may be placed on a proper location on the bottom side of the interposer to facilitate attachment of the interposer to a PCB.

As noted above, typical processes of implementing mold layers are associated with high temperature processes (e.g. between 100-200° C.). This may cause cracks in the packaged elements (e.g. in the wafer) due to CTE mismatches between the elements. Therefore, use of the conventional molding techniques in the present invention may in some cases result in improper sealing of the integrated electric device and/or with impairment of the functional/structural integrity of the device.

Figure 4A:
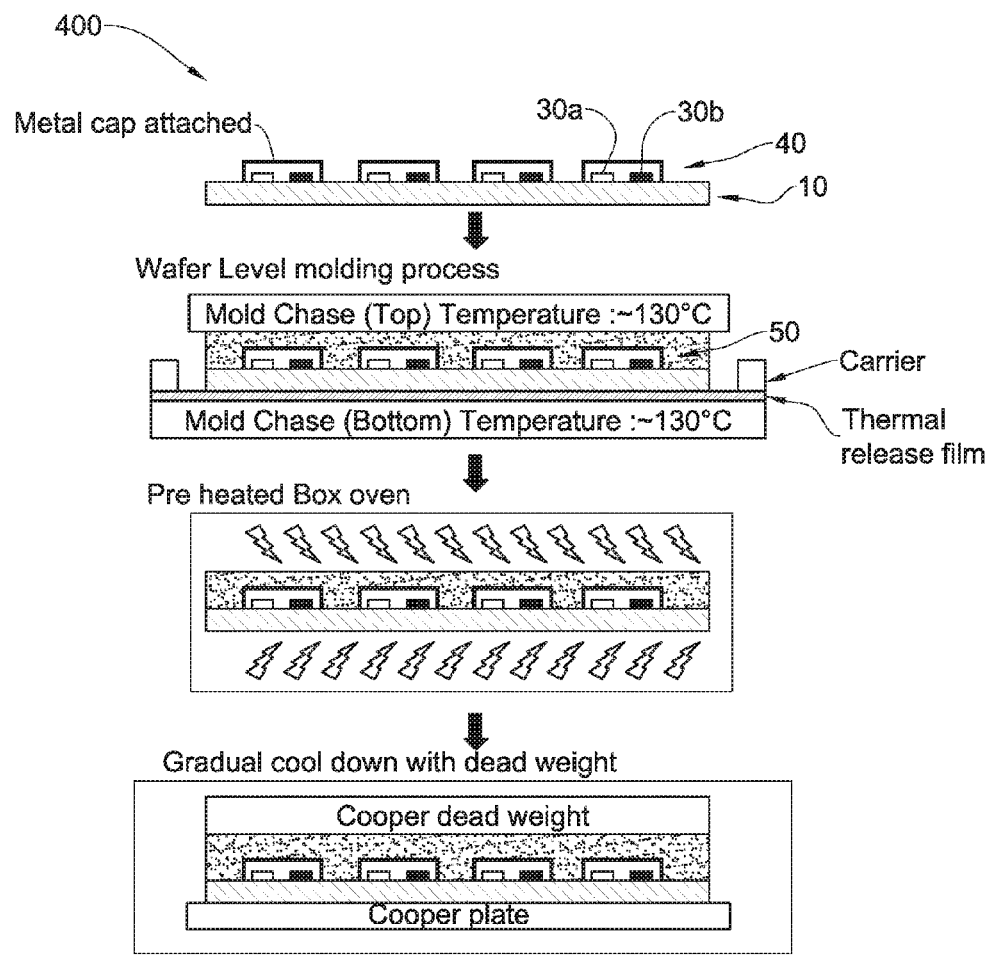
FIGS. 4A to 4D illustrate a method according to the present invention of applying a mold layer to an integrated electronic structure used for reducing/preventing cracks and warpage of the structure.
Figure 4B:
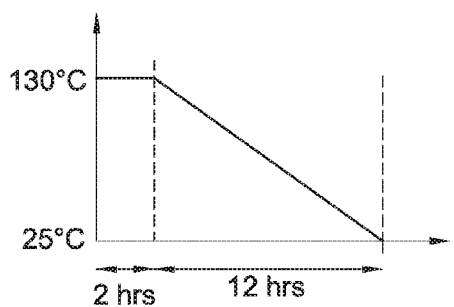

Reference is now made together to FIGS. 4A to 4D illustrating a novel method for applying the mold layer according to some embodiments of the present invention. The method provides significant reduction and possibly elimination of crack/warpage formation. FIG. 4A shows in more detail a method 400 for implementing the molding layer while eliminating or at least reducing formation of cracks and/or warpage in an integrated electric device covered by the mold. To this end, method 400 enables production of near hermetically sealed packaging of an integrated electric device by preventing/substantially reducing formation of cracks in at least one of the mold layer 50, the cap 40. Also, method 400 enables to maintain the structural and functional integrity of the device during the molding process as it prevents, or at least substantially reduces, cracks and/or warpage of interposer structure 10 (e.g. the wafer) and/or of the active components installed thereon. The method 400 includes the following:

410—providing the integrated structure to be molded. Here, a wafer/interposer structure 10 mounted with an array of integrated devices similar to the integrated device 1 of FIG. 1 is provided (namely each associated with a region of the interposer structure/wafer 1 and includes one or more active components 30a and 30b, and a metal cap (e.g. metal) 40 that defines a cavity encapsulating the active component (s)). It should be however understood that the molding technique provided herein may be also used for molding various other types of integrated structures.

420—applying the mold layer at the appropriate regions of the wafer/integrated structure(s) at which molding is required. Here, the molding is applied on the upper/top surface of the wafer 10 such as to cover the active components with the metal caps. Also, here the mold layer is applied utilizing a mold chase (e.g. casting pattern from above and/or below) for injecting the mold material. In the present example, the mold material used is Hitachi CE500S Powder which is applied at a temperature of about 130° C. In this connection other mold materials may also be used in the technique of the present invention which may require different temperatures for application and baking (e.g. typical temperatures may range from 100° C. to 200° C. depending on material).

430—entering/baking the integrated-structure/wafer with the mold layer applied thereto, in an oven for baking at the desired baking temperature. According to some embodiments of the invention, the oven is appropriately pre-heated in advance in order to reduce variations in the temperature of the molded integrated device and prevent thermal shock which may cause warpage and/or cracks. Specifically, according to some embodiments of this technique the baking temperature is selected to be about the temperature of the injected mold (e.g. about 130° C. in the present case).

440—applying a gradual cool down and optionally also substantially homogeneous cool down of the wafer/integrated-structure with the mold on top. This stage of gradual cool down and homogeneous cool down is effective for the prevention of cracks/warpage in the mold and/or in other elements (e.g. cap and/or interposer/wafer) of the integrated-structure.

In this regard according to conventional techniques, the wafer/structure are typically cooled down at an ambient temperature (e.g. without controlling the rate of the cooling down and its homogeneity). Therefore, in many cases CTE mismatches between different elements/regions of the structure and/or non-homogeneous temperature variations during the cooling stage cause stresses/tensions in the integrated structure and eventually cause formation of warpage and/or cracks in the structure.

In accordance with the present invention, the temperatures during the cooling down stage are actively and/or passively controlled (e.g. by cooling down in an oven and/or utilizing metal/copper plates to respectively actively and/or passively control the cooling down process). A graph illustrating the temperature and duration of the baking and cool down stages 430 and 440, according to some embodiments of the present invention, is provided for example in FIG. 4B. In the present example, the integrated-structure/wafer with the mold are baked for a predetermined duration of about 2 hours at a steady temperature of about 130° C. Then, integrated-structure/wafer with the mold are gradually cooled. In this example, baking duration is about 2 hours at a temperature of about 130° C. and then gradually cool down for a duration of about 12 hours from 130° C. to an ambient temperature of about 25° C. (namely, a cooling rate of about 8 to 10° C./hour). Note that the cooling rate used may depend on the size of the structure/wafer, so that larger wafers may require slower rates and vice-versa. In the present example cooling down of a molded 6 inch wafer, which has an integrated structure(s) similar to that of FIG. 1 fabricated thereon, is considered.

According to some embodiments of the present invention, one or more heat conducting plates having relatively high thermal mass (e.g. relative to the wafer/integrated structure) are used during the cooling stage to facilitate gradual and homogeneous cooling. For example, such plate(s) may reside in the oven to be preheated to the baking temperature during the baking stage 430. During/before the cool down stage the plate(s) are brought into thermal contact with the integrated structure/wafer to facilitate the gradual and homogeneous cool down. Also, according to some embodiments of the present invention, at least one plate having significant weight is used. The heavy weight plate is placed on top of the molded wafer/integrated structure during/before the cool down stage such as to press onto the structure during the cooling stage (e.g. pressing it inbetween the top and bottom plates) and thereby further reduce warpage and/or cracking of the structure.

Figure 4C:
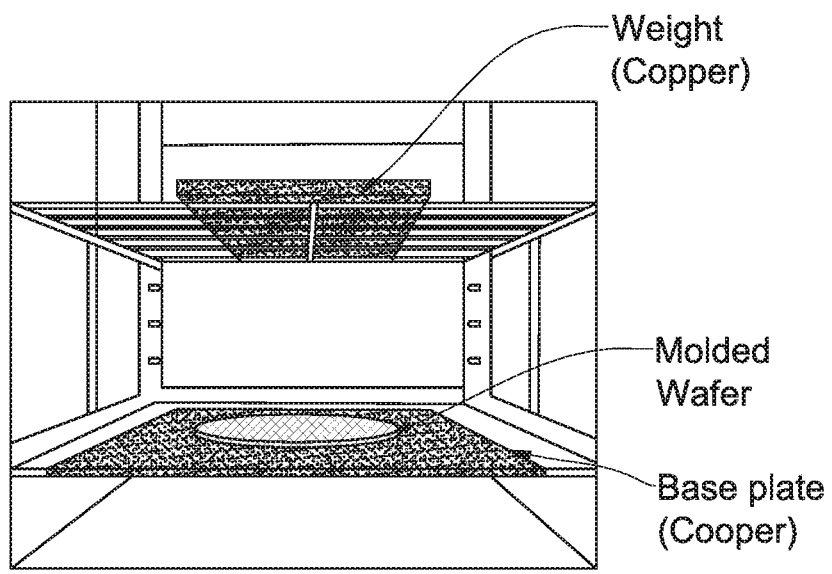
Figure 4D:
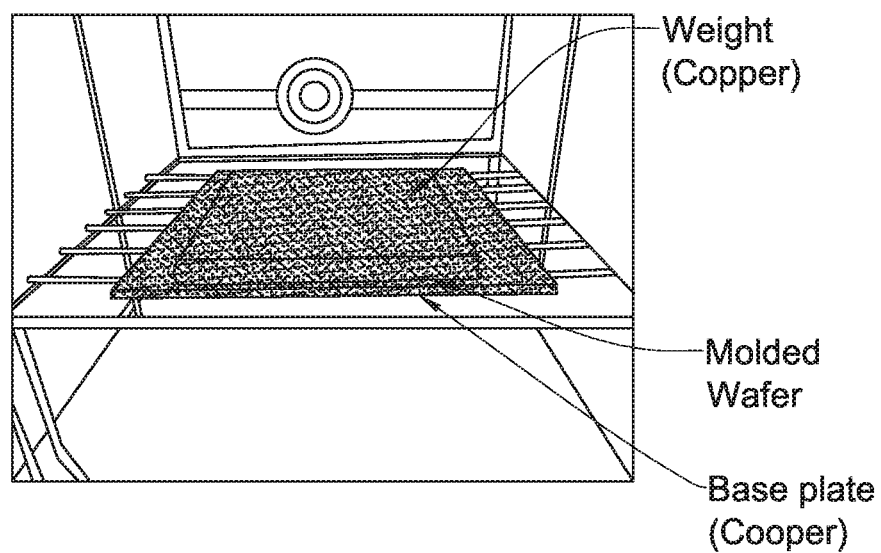

According to some specific embodiments of the present invention, two plates are used: bottom and top plates wherein at least the top plate has significant thermal mass and weight. The plates may for example be made of metals, such as copper, having relatively high thermal conductivity (e.g. thermal conductivity of copper is about 400 Watts/(Meters*° C.). Also, the metal plate should preferably have sufficient thermal mass and possibly also sufficient weight (e.g. in the case of the top plate) in order to enable its effective operation in distributing heat and equilibrating the temperatures at different regions of the device and/or to enable its proper operation in exerting pressure on the wafer/structure to reduce warpage. Accordingly, in the present example, two copper plates with thickness in the order of about 1-5 cm or more are used. FIGS. 4C and 4D respectively depict in a self explanatory manner, the baking and gradual cool-down procedures according to some embodiments of the present invention in which metal/copper plates are used. Here, the metal plates are also pre-heated (e.g. during the baking step 430) such that when they are brought into thermal contact with the integrated-structure (e.g. in the gradual cool-down stage 440), they have substantially the same temperatures, thus not affecting cracking/warpage to the structure due to thermal "shock".

The present invention thus provides a System-in-Package (SIP) technique advantageously allowing reducing the size and complexity in assembling and integrating together different active components of different semiconductor/wafer technologies. The SIP technology of the present invention may be configured and operable in an extensive/extreme range of temperature and humidity conditions while also facilitating the integration of the different active components carried by the common substrate (e.g. mounted-on or implemented-in the common interposer structure). The active components may be furnished on the interposer utilizing wafer level packaging techniques. Additionally, the SIP technology of the present invention allows the packaging of high frequency components with improved signal losses (improving the insertion and return losses of signals from such high frequency components). To this end, the SIP technology of the invention may also provide for reducing the costs associated with integration of active components of different technologies since the assembly of the different components may be carried out in a single fabrication plant (i.e. FAB; e.g. in silicon FAB), thus not requiring separate FABs for packaging the different components.

The invention claimed is:

1. An integrated circuit device, comprising:
an interposer structure and two or more active components carried by said interposer structure, and said interposer structure includes an interposer substrate including a certain semi-conductor material and a plurality of vias formed in the substrate;
wherein said two or more active components include at least two components, which are respectively constructed of at least two different semiconductor materials, carried by at least two different respective regions of the interposer structure, said two or more active components include at least one active component, whose semi-conductor materials are different than the certain semi-conductor material of the interposer substrate and have a coefficient of thermal expansion (CTE) different than a CTE of the certain semi-conductor material of the interposer substrate;
wherein said interposer structure includes at least two different respective arrangements of the vias in said at least two different respective regions of the interposer structure, at which said at least two components of the at least two different semiconductor materials are located;
wherein said vias having CTEs substantially different than the CTE of the interposer substrate; and
wherein configurations of said at least two different arrangements of the vias are different with respect to at least one parameter of the arrangements such that effective CTEs of the interposer structure, including the interposer substrate and the arrangements of vias at said at least two different respective regions, respectively match the CTEs of the semiconductor materials of the respective at least two components that are carried by the interposer structure at said at least two regions respectively, thereby providing that said interposer structure with said at least two active components of the at least two different semiconductor materials being mechanically stable under varying temperature conditions.

2. The integrated circuit device of claim 1 wherein said interposer structure is configured as an active interposer in which at least one of the two or more active components is implemented as an active component integrated with said interposer structure and thereby being carried by said interposer.

3. The integrated circuit device of claim 1 wherein said interposer structure is mechanically stable under extreme temperature conditions ranging between −65° C. to 150° C.

4. The integrated circuit device of claim 1 wherein said components of at least two different semiconductor materials include at least two of the following semiconductor materials: Si, SiGe, SiC, GaAs, or GaN.

5. The integrated circuit device of claim 1 wherein said spaced-apart vias include conductive vias electrically connected with said two or more active components by at least one of the following: wire-bonding or flip-chip electrical connections.

6. The integrated circuit device of claim 5 wherein said interposer structure includes one or more Redistribution Layers (RDLs) furnished on at least a bottom surface of the interposer structure for providing wiring connections to the conductive vias of the interposer structure.

7. The integrated circuit device of claim 1 wherein said interposer structure includes silicon (Si) based interposer substrate with an arrangement of Copper (Cu) vias formed therein.

8. The integrated circuit device of claim 1, wherein the mechanical stability of the interposer structure allows carrying said active components of sizes up to about 25×25 mm.

9. The integrated circuit device of claim 1, further comprising:
   at least one metal cap that is furnished on said top surface of the interposer structure; and
   wherein lateral dimensions, thickness, and material composition of said at least one metal cap are configured and to endure tensions and/or stresses affected between a boundary of the interposer structure and the at least one metal cap under the varying temperature conditions, thereby enforcing the structural integrity and mechanical stability of said interposer structure.

10. The integrated circuit device of claim 9 wherein said material composition of said at least one metal cap is similar to a material composition of vias formed in a substrate of the interposer structure.

11. The integrated circuit device of claim 1 wherein a bonding material used for furnishing said active components carried by the interposer structure is elastic for enduring stresses that may occur under said varying temperature conditions due to a difference in coefficients of thermal expansion between the active components and the interposer structure.

12. The integrated circuit device of claim 1 wherein the interposer structure is configured in at least one of the following configurations providing improved heat evacuation from the active components mounted thereon:
   (a) said interposer substrate includes a material having relatively high thermal conductivity; and
   (b) at least some of the vias are formed from a material having relatively high thermal conductivity and wherein locations and lateral dimensions of at least some of the vias are selected in accordance with locations and characteristic sizes of at least some of the pattern features within at least one active component which are associated with substantial heat emission, thereby providing sufficient thermal coupling between the at least some vias and said features allowing diffusion of heat therefrom during operation under extreme temperatures conditions.

13. The integrated circuit device of claim 12 wherein said at least one active component is a signal amplifier component associated with substantial heat emission.

14. The integrated circuit device of claim 1, further comprising:
   at least one metal cap that is furnished on said top surface of the interposer structure and encapsulates at least one active component of said two or more active components;
   wherein said at least one active component is configured to operate with high frequency signals; and
   wherein said at least one metal cap is configured to define a cavity providing a sufficient gap between said at least one active component and other dielectric materials of said integrated circuit device such that electrical impedance of said at least one active component is substantially not affected by said other dielectric materials thereby facilitating proper operation of said one active component.

15. The integrated circuit device of claim 14, wherein said at least one active component encapsulated by the metal cap is a high frequency component operating with high frequency signals, and wherein electrical connection in between certain vias in a substrate of said interposer structure and said high frequency component are configured as RF connections utilizing balanced RF lines.

16. The integrated circuit device of claim 1, further comprising:
   at least one metal cap that is furnished on said top surface of the interposer structure and encapsulates at least one active component of said two or more active components;
   a vent opening defined in the metal cap for preventing pressure build up in a cavity between the metal cap and said interposer structure under the varying temperature conditions; and
   a mold layer covering the top surface of the interposer structure with said at least one metal cap;
   wherein said metal cap thereby provides a near hermetically sealed packaging of said at least one active component that is suitable for operating said at least one active component under said varying temperature conditions and under various humidity conditions.

17. The integrated circuit device of claim 1 wherein said at least one parameter includes at least one of the following: diameters of the vias; pitches of the vias in said arrangements of vias; materials of said vias; or fraction of a surface area covered by the vias.

18. The integrated circuit device of claim 1 wherein said at least one parameter comprises at least one of the following: (i) diameters of the vias, (ii) pitches of the vias in said arrangements of vias, (iii) materials of said vias, or (iv) fraction of a surface area covered by the vias; thereby providing different effective coefficients of thermal expansion (CTEs) of the interposer structure at said at least two different respective regions that are matching the CTEs of the semiconductor materials of the respective components in said at least two regions.

19. A method for manufacturing an integrated circuit device, the method comprising:
   providing an interposer substrate of a certain semi-conductor material; and
   implementing one or more arrangements of spaced apart vias in the interposer substrate to generate an interposer structure including at least the interposer substrate and the vias;
   wherein said arrangements of said vias include at least one arrangement of vias is located at a certain region of said interposer structure at which an active component of semi-conductor material different than said certain semi-conductor material of the interposer substrate is to be carried by the interposer structure;
   wherein the vias of said at least one arrangement having CTEs substantially different than the CTE of the interposer substrate; and wherein at least one parameter of said at least one arrangement of vias is selected such that effective coefficient of thermal expansion (CTE) of the interposer structure including the interposer substrate and the arrangement of vias at said certain region, match CTE of the semi-conductor material of said active component; said at least one parameter including at least one of the following: diameters of the vias; pitches of the vias in said arrangements of vias; materials of said vias; or fraction of a surface area covered by the vias.

20. The method according to claim 19 wherein the interposer substrate carries at least one additional active component that is made of a semi-conductor material similar to said certain semiconductor material of the interposer substrate and wherein the at least one of the following:
   a) said interposer structure is a passive interposer and the method comprises providing and mounting said at least one additional active component on the interposer structure;
   b) said interposer structure is an active interposer including at least one of the active components implemented thereon.

21. The method according to claim 19, further comprising configuring at least one of the locations and dimensions of one or more of said vias to provide heat evacuation from one or more features of at least one said active component that are associated with substantial heat emission.

22. The method according to claim 19, further comprising:
   providing said at least one active component of said semi-conductor material different than said certain semi-conductor material of the interposer substrate; and
   mounting said at least one active component at said region of the interposer structure.

23. An integrated circuit device, comprising:
   an interposer structure comprising an interposer substrate of a certain semi-conductor material, and a plurality of vias formed in the interposer substrate; and
   an active component formed with a semi-conductor material different than said certain semi-conductor material of the interposer substrate and being carried at a certain region of said interposer structure;
   wherein a coefficient of thermal expansion (CTE) of the semi-conductor material of the active component is different than a CTE of the interposer substrate; and
   wherein said certain region of the interposer structure, at which said active component being carried, comprises a spaced apart arrangement of one or more of said vias whereby CTEs of said vias are substantially different than the CTE of the interposer substrate, and wherein at least one parameter of said spaced apart arrangement is configured such that effective the CTE of the interposer structure including the interposer substrate and the spaced apart arrangement of said vias in said certain region, matches said CTE of the semi-conductor material of the active component being carried at said certain region,
   thereby enabling the interposer structure and the active component carried thereby to remain mechanically stable under varying temperature condition despite a CTE mismatch between the interposer substrate and the active component.

24. The integrated circuit device, of claim 23 wherein said at least one parameter includes at least one of the following: diameters of the vias; pitches of the vias in said arrangements of vias; materials of said vias; or fraction of a surface area covered by the vias.

* * * * *